(12) United States Patent
Lee et al.

(10) Patent No.: US 9,196,630 B2
(45) Date of Patent: Nov. 24, 2015

(54) SEMICONDUCTOR DEVICES HAVING CARBON-CONTAINED POROUS INSULATION OVER GATE STACK STRUCTURES

(71) Applicants: Bo-Young Lee, Hwaseong-si (KR); Jongwan Choi, Suwon-si (KR); Myoungbum Lee, Seoul (KR)

(72) Inventors: Bo-Young Lee, Hwaseong-si (KR); Jongwan Choi, Suwon-si (KR); Myoungbum Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/519,821

(22) Filed: Oct. 21, 2014

(65) Prior Publication Data
US 2015/0060988 A1    Mar. 5, 2015

Related U.S. Application Data

(62) Division of application No. 13/599,844, filed on Aug. 30, 2012, now Pat. No. 8,883,611.

(30) Foreign Application Priority Data

Sep. 1, 2011    (KR) .......................... 10-2011-0088588

(51) Int. Cl.
| | | |
|---|---|---|
| H01L 29/792 | (2006.01) | |
| H01L 27/115 | (2006.01) | |
| H01L 21/764 | (2006.01) | |
| H01L 21/762 | (2006.01) | |
| H01L 23/528 | (2006.01) | |
| H01L 23/532 | (2006.01) | |

(52) U.S. Cl.
CPC ........ *H01L 27/11582* (2013.01); *H01L 21/764* (2013.01); *H01L 21/76229* (2013.01); *H01L 23/528* (2013.01); *H01L 23/5329* (2013.01); *H01L 27/1157* (2013.01); *H01L 27/11524* (2013.01); *H01L 27/11556* (2013.01)

(58) Field of Classification Search
None
See application file for complete search history.

(56) References Cited

U.S. PATENT DOCUMENTS

| | | | |
|---|---|---|---|
| 6,333,556 B1 | 12/2001 | Juengling et al. | |
| 7,534,696 B2 | 5/2009 | Jahnes et al. | |
| 2006/0281295 A1 | 12/2006 | Naujok et al. | |
| 2009/0108333 A1* | 4/2009 | Kito et al. | 257/324 |
| 2009/0283819 A1* | 11/2009 | Ishikawa et al. | 257/324 |
| 2009/0298257 A1 | 12/2009 | Lee et al. | |
| 2010/0019311 A1 | 1/2010 | Sato et al. | |
| 2012/0261788 A1 | 10/2012 | Lin et al. | |

FOREIGN PATENT DOCUMENTS

| | | |
|---|---|---|
| JP | 2010003983 A | 1/2010 |
| JP | 2010225916 A | 10/2010 |
| KR | 20120026313 A | 3/2012 |

* cited by examiner

*Primary Examiner* — Michael Jung
(74) *Attorney, Agent, or Firm* — Harness, Dickey & Pierce

(57) ABSTRACT

Semiconductor devices, and methods of fabricating the same, include forming a trench between a plurality of patterns on a substrate to be adjacent to each other, forming a first sacrificial layer in the trench, forming a first porous insulation layer having a plurality of pores on the plurality of patterns and on the first sacrificial layer, and removing the first sacrificial layer through the plurality of pores of the first porous insulation layer to form a first air gap between the plurality of patterns and under the first porous insulation layer.

5 Claims, 48 Drawing Sheets

SEMICONDUCTOR DEVICES HAVING CARBON-CONTAINED POROUS INSULATION OVER GATE STACK STRUCTURES

CROSS-REFERENCE TO RELATED APPLICATIONS

This U.S. non-provisional patent application is a divisional application of U.S. application Ser. No. 13/599,844 filed on Aug. 30, 2012 and which has issued as U.S. Pat. No. 8,883,611, and claims priority under 35 U.S.C. §119 to Korean Patent Application No. 10-2011-0088588, filed on Sep. 1, 2011, the entire contents of each of which is hereby incorporated herein by reference.

BACKGROUND

1. Technical Field

Example embodiments herein relate to semiconductor devices and methods of fabricating the same.

2. Description of Related Art

Semiconductor devices are becoming more highly integrated to meet the requirements of customers (e.g., in order to provide high performance and/or low cost thereof). The integration density of the semiconductor devices is a factor that may directly influence the cost of the semiconductor devices. Thus, the semiconductor devices are continuously scaled down. As the semiconductor devices become more highly integrated, critical dimensions (CDs) of patterns in the semiconductor devices are reduced to decrease spaces between active regions and between interconnections.

SUMMARY

Example embodiments are directed to semiconductor devices and methods of fabricating the same.

In example embodiments, the semiconductor device includes a plurality of patterns on a substrate to be adjacent to each other, and a porous insulation layer on the plurality of patterns. The porous insulation layer extends onto spaces between the patterns. The porous insulation layer is spaced apart from the substrate to provide a plurality of air gaps between the plurality of patterns.

Each of the plurality of patterns may include a non-insulating material.

In other example embodiments, the semiconductor device includes an insulating isolation layer in a trench that defines a plurality of active regions extending in a first direction, and a plurality of first porous insulation layers over the insulating isolation layer. Each of the plurality of first porous insulation layers is spaced apart from the insulating isolation layer by a first air gap.

A top surface of the insulating isolation layer may be at a lower level than a top surface of the plurality of active regions.

The semiconductor device may include a liner insulation layer between the insulating isolation layer and an inner surface of the trench. The liner insulation layer may extend toward a bottom surface of each of the plurality of first porous insulation layers.

The first air gap may be surrounded by a top surface of the insulating isolation layer, the liner insulation layer and the bottom surface of one of the plurality of first porous insulation layers. A lower width of the first air gap may be less than an upper width thereof.

The semiconductor device may further include a tunnel insulation layer on a plurality of active regions, a plurality of gate electrodes over the charge storage layer and extending over the plurality of first porous insulation layers along a second direction intersecting the first direction, and a blocking insulation layer between the charge storage layer and the plurality of gate electrodes.

The semiconductor device may further include a plurality of sacrificial patterns between the plurality of first porous insulation layers and the plurality of gate electrodes.

The charge storage layer may be a floating gate electrode, and an upper surface of the plurality of first porous insulation layers may be located at a level between a bottom surface and a top surface of the floating gate electrode.

The charge storage layer may be a charge trap layer, and the charge storage layer may extend over the plurality of first porous insulation layers.

The semiconductor device may further include a second porous insulation layer extending over the plurality of gate electrodes and spaces between the plurality of gate electrodes. The second porous insulation layer may provide a plurality of second air gaps between the plurality of gate electrodes and the plurality of second air gaps may extend in the second direction.

The semiconductor device may further include a sidewall spacer on each sidewall of the plurality of gate electrodes.

The first air gap may extend in the first direction and is spatially connected to the plurality of second air gaps.

In example embodiments, the semiconductor device includes a gate insulation layer on a substrate, a plurality of gate electrodes over the gate insulation layer and extending in a first direction. An air gap is between adjacent gate electrodes of the plurality of gate electrodes. The semiconductor device includes a porous insulation layer on the plurality of gate electrodes and extending over the air gap between the adjacent gate electrodes.

The semiconductor device may further include a sidewall spacer on each sidewall of the plurality of gate electrodes.

The plurality of gate electrodes may include a plurality of string selection lines, a plurality of ground selection lines, and a plurality of word lines between one the plurality of string selection lines and one of the plurality of ground selection lines. The semiconductor device may further include an insulation spacer layer between neighboring string selection lines of the plurality of string selection lines, and a bit line connected to the substrate through a contact extending through the porous insulation layer and the insulation spacer layer.

The sidewall spacer and the insulation spacer layer may be formed of a same material.

The porous insulation layer extending over the air gap between the adjacent gate electrodes may be at a lower level than the porous insulation layer on the plurality of gate electrodes.

Each of the plurality of gate electrodes may correspond to a gate stack. The gate stack may include a floating gate electrode, a control gate electrode on the floating gate electrode, and a blocking insulation layer between the control gate electrode and the floating gate electrode. The gate insulation layer may correspond to a tunnel insulation layer.

The gate insulation layer may include a tunnel insulation layer, a charge trap layer and a blocking insulation layer which are sequentially stacked.

Each of the plurality of gate electrodes may correspond to a gate stack. The gate stack may include a plurality of gates. The plurality of gates may include a lower selection gate, an upper selection gate and a plurality of control gates therebetween. The semiconductor device may further include a capping layer covering a top surface and sidewalls of the gate stack.

The semiconductor device may further include a plurality of inter-gate insulation layers separating the lower selection gate, the upper selection gate and the plurality of control gates from each other, a plurality of active pillars penetrating the lower selection gate, the upper selection gate, the plurality of control gates and the plurality of inter-gate insulation layers so as to be connected to the substrate, and a charge storage layer between the plurality of active pillars and the plurality of gates.

The charge storage layer may extend between the plurality of inter-gate insulation layers and the plurality gates.

In example embodiment, the semiconductor device includes a substrate including an active region pattern having a plurality of active regions extending in a first direction and spaced apart from each other in a second direction intersecting the first direction, and a porous insulation layer extending over spaces between adjacent regions of the plurality of active regions and spaced apart from an upper surface of the substrate so as to form a gap between the adjacent regions, wherein the gap is filled with a gas having a dielectric constant lower than a dielectric constant of the porous insulation layer.

The semiconductor device may further include an insulating isolation layer between the adjacent regions of the plurality of active regions and under the porous insulation layer. The porous insulation layer may be spaced apart from the insulating isolation layer by the gap.

Example embodiments are directed to methods of fabricating a semiconductor device.

In example embodiments, the method includes forming a trench between a plurality of patterns on a substrate to be adjacent to each other, forming a first sacrificial layer in the trench, forming a first porous insulation layer having a plurality of pores on the plurality of patterns and on the first sacrificial layer, and removing the first sacrificial layer through the plurality of pores of the first porous insulation layer to form a first air gap between the plurality of patterns and under the first porous insulation layer.

The first sacrificial layer may be one selected from a spin on hardmask (SOH) layer and a photoresist layer.

Removing the first sacrificial layer may include using one selected from the group consisting of an oxygen treatment process, an ozone treatment process, an ultraviolet radiation process and a wet cleaning process.

Forming the first porous insulation layer may include forming a silicon oxide layer containing carbon, and annealing the silicon oxide layer containing carbon.

Forming the trench may include etching the substrate using the plurality of patterns as etching masks to define a plurality of active regions in the substrate.

The method may further include forming an insulating isolation layer in a lower portion of the trench prior to forming the first sacrificial layer. The first sacrificial layer may be formed on the insulating isolation layer to fill an upper portion of the trench.

Forming the insulating isolation layer in the lower portion of the trench may include forming a liner insulation layer on sidewalls and a bottom surface of the trench, forming the insulating isolation layer on the liner insulation layer, and removing an upper portion of the insulating isolation layer. The first sacrificial layer may be formed on a top surface of the insulating isolation layer. The top surface of the insulating isolation layer may be at a lower level than a top surface of each of the plurality of active regions.

The liner insulation layer may include a silicon oxide layer and a silicon nitride layer.

The method may further include removing the plurality of patterns to expose the plurality of active regions, prior to forming the first porous insulation layer, sequentially forming a tunnel insulation layer and a floating gate electrode on each of the exposed plurality of active regions, forming a second sacrificial layer on the first porous insulation layer, recessing the second sacrificial layer and the first porous insulation layer to expose a top surface of the floating gate electrode on each of the exposed plurality of active regions, and sequentially forming a blocking insulation layer and a control gate electrode on the floating gate electrode on each of the exposed plurality of active regions.

Each of the plurality of patterns may be a floating gate electrode, and the method may further include forming a tunnel insulation layer under the floating gate electrode, forming a second sacrificial layer on the first porous insulation layer, recessing the second sacrificial layer and the first porous insulation layer to expose a top surface of the floating gate electrode, and sequentially forming a blocking insulation layer and a control gate electrode on the floating gate electrode.

The method may further include forming a second sacrificial layer on the first porous insulation layer, and recessing the second sacrificial layer and the first porous insulation layer to expose a top surface of each of the plurality of patterns.

The method may further include removing the plurality of patterns to expose the plurality of active regions, and sequentially forming a charge storage layer and a gate electrode on each of the exposed plurality of active regions.

Each of the plurality of patterns may include a plurality of gates. The plurality of gates may include a lower selection gate, an upper selection gate and a plurality of control gates therebetween.

The method may further include forming a capping layer covering a top surface and sidewalls of each of the plurality of patterns.

The method may further include forming a plurality of active pillars extending through the plurality of gates so as to be connected to the substrate, and forming a charge storage layer between the plurality of active pillars and the plurality of gates.

In other example embodiments, the method includes forming a trench extending along a first direction in a substrate to define a plurality of active regions, forming an insulating isolation layer having a top surface at a lower level than a top surface of each of the plurality of active regions in a lower portion of the trench, forming a first sacrificial layer on the insulating isolation layer to fill an upper portion of the trench, forming a first porous insulation layer having a plurality of pores on the first sacrificial layer, and removing at least a portion of the first sacrificial layer through the plurality of pores of the first porous insulation layer to form a first air gap extending in the first direction between the plurality of active regions and under the first porous insulation layer.

The method may further include forming a charge storage layer on the plurality of active regions and forming a plurality of gate electrodes on the charge storage layer and extending in a second direction intersecting the first direction.

The method may further include filling spaces between the plurality of gate electrodes and a portion of the first air gap with a buried insulation layer to form a second air gap under the first porous insulation layer. A lower width of the second air gap may be less than an upper width thereof.

The method may further include forming a sidewall spacer on each sidewall of the plurality of gate electrodes, forming a second sacrificial layer filling spaces between the plurality of gate electrodes and the first air gap, forming a second porous insulation layer having a plurality of pores on the second sacrificial layer and on the plurality of gate electrodes, and removing at least a portion of the second sacrificial layer through the plurality of pores of the second porous insulation layer to form a third air gap and a plurality fourth air gaps. The third air gap may extend in the first direction between the first porous insulation layer and the insulating isolation layer. Each of the plurality of fourth air gaps may extend in the second direction between the plurality of gate electrodes and under the second porous insulation layer.

Each of the plurality of gate electrodes may include a plurality of string selection lines, a plurality of ground selection lines, and a plurality of word lines between one of the string selection lines and one of the ground selection lines. Forming the sidewall spacer on each of the sidewalls may include forming a spacer layer on the plurality of gate electrodes, forming a mask layer on the spacer layer between neighboring string selection lines of the plurality of string selection lines, and anisotropically etching the spacer layer using the mask layer as an etch mask.

Anisotropically etching the spacer layer may provide an insulation spacer layer having a 'U'-shaped cross section under the mask layer. The second sacrificial layer between the neighboring string selection lines may remain, after removing the at least portion of the second sacrificial layer. The method may further include forming a bit line contact extending through the second porous insulation layer and the insulation spacer layer, and forming a bit line connected to the substrate through the bit line contact.

In example embodiments, the method of fabricating a semiconductor device, the method includes providing a substrate including an active region pattern having a plurality of active regions extending in a first direction and spaced apart from each other in a second direction intersecting the first direction, forming a sacrificial layer between adjacent regions of the plurality of active regions, forming an insulation layer extending over the active region pattern and the sacrificial layer, and removing the sacrificial layer using an etchant penetrating the insulation layer to form a cavity between the adjacent regions of the plurality of active regions and under the insulation layer.

The method may further include forming an insulating isolation layer between the adjacent regions of the plurality of active regions, prior to forming the sacrificial layer, wherein the insulating isolation layer is formed of a material having an etching selectivity with respect to that of the sacrificial layer.

The etchant may pass through a plurality of pores of the insulation layer.

The cavity may contain a gas having a dielectric constant lower than a dielectric constant of the insulation layer.

BRIEF DESCRIPTION OF THE DRAWINGS

The above and other features of the disclosure will become more apparent in view of the attached drawings and accompanying detailed description.

DETAILED DESCRIPTION OF THE EMBODIMENTS

Figure 1:
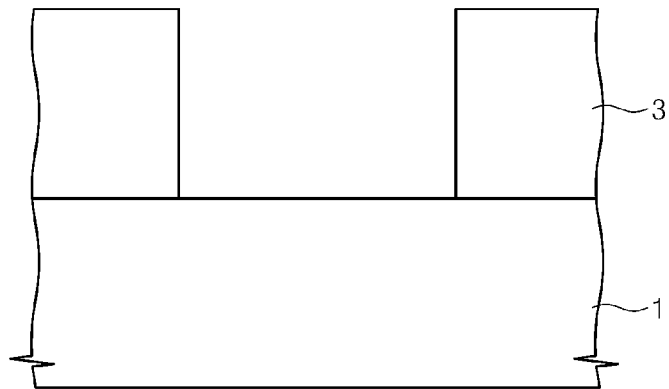
FIGS. 1 to 3 are cross sectional views illustrating example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments herein relate to semiconductor devices and methods of fabricating the same.

Hereinafter, the example embodiments will be described in detail.

Figure 2:
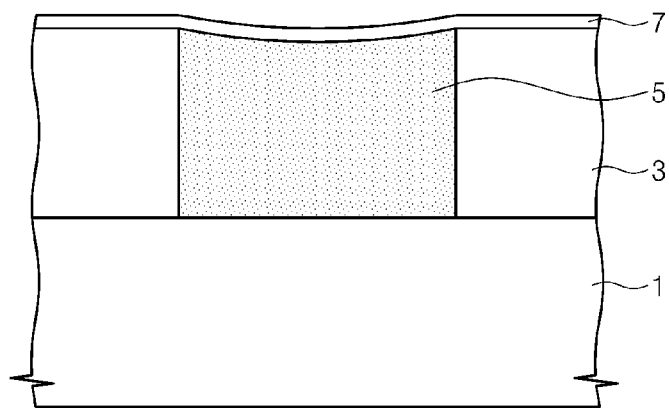
Figure 3:
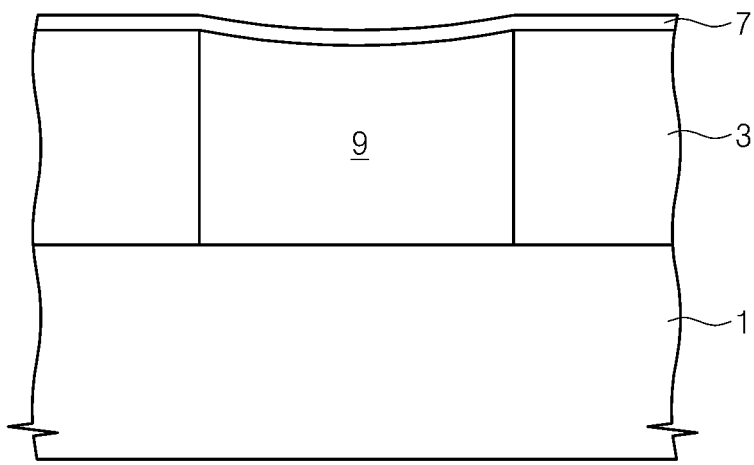

FIGS. 1 to 3 are cross sectional views illustrating example embodiments.

Referring to FIG. 1, patterns 3 are disposed on a substrate 1 to be adjacent to each other. The substrate 1 may include one selected from the group consisting of a single crystalline silicon layer, a silicon on insulator (SOI) substrate, a silicon on silicon-germanium substrate, a single crystalline silicon on insulator substrate, and a polycrystalline silicon on insulator substrate. The substrate 1 may further include an insulating structure, a circuit structure or an interconnection structure formed thereon. Each of the patterns 3 may include a non-insulating material (e.g., a conductive material, a metal material or a doped semiconductor). Preferably, each of the patterns 3 may be a material through which currents can flow. Each of the patterns 3 may include an upper capping layer (not shown) formed thereon.

Referring to FIG. 2, a sacrificial layer 5 may be formed to fill a space between the adjacent patterns 3. The sacrificial layer 5 may be a material that is more readily removable as compared with the substrate 1 and the patterns 3. That is, the sacrificial layer 5 may have an etch selectivity with respect to the substrate 1 and the patterns 3. For example, the sacrificial layer 5 may be formed of a spin on hard mask (SOH) layer. The SOH layer may be an insulation layer of a hydrocarbon ($C_xH_y$) system. Alternatively, the sacrificial layer 5, for example, may be formed of photoresist or amorphous silicon. An upper portion of the sacrificial layer 5 may be removed to expose top surfaces of the patterns 3.

A porous insulation layer 7 having a plurality of pores may be formed on the patterns 3 to extend onto the sacrificial layer 5. The porous insulation layer 7 may be a low-k dielectric layer. For example, the porous insulation layer 7 may be formed by annealing a silicon oxide layer containing carbon. While the silicon oxide layer containing carbon is annealed, the carbon and the silicon in the silicon oxide layer may be combined with each other to transform a $SiO_2$ network structure of the silicon oxide layer into a cage-like structure having a less dense structure than the silicon oxide layer. The silicon oxide layer having the cage-like structure may correspond to a porous SiCOH layer. Trimethylsilane (($CH_3$)$_3$—Si—H) 3MS, tetramethylsilane (($CH_3$)$_4$—Si) 4MS, or vinyltrimethylsilane ($CH_2$=CH—Si($CH_3$)$_3$) VTMS may be used as a precursor of the SiCOH layer. An oxidizer, for example, a hydrogen peroxide gas containing oxygen may be used in oxidation of the precursor. The silicon oxide layer containing carbon may be formed using a plasma enhanced chemical vapor deposition (PECVD) process or an atomic layer deposition (ALD) process. The silicon oxide layer containing carbon may be transformed into the porous insulation layer 7 (i.e., the porous SiCOH (p-SiCOH) layer) by an annealing process. The pores in the porous insulation layer 7 may have a size (e.g., a diameter) of about several ten nanometers to about several hundred nanometers.

Referring to FIG. 3, the sacrificial layer 5 may be selectively removed using a chemical gas or a wet etchant penetrating the porous insulation layer 7 via the pores. When the sacrificial layer 5 is formed of a SOH layer or a photoresist layer, the sacrificial layer 5 may be removed using an ashing process or a wet cleaning process. The ashing process may employ (or, use) an oxygen gas, an ozone gas and/or ultraviolet rays as an etchant. When the sacrificial layer 5 is formed of an amorphous silicon layer, the sacrificial layer 5 may be removed using an isotropic etching process. The isotropic etching process may employ (or, use) a chlorine gas as an etching gas.

As a result of selective removal of the sacrificial layer 5, an air gap 9 may be formed between the adjacent patterns 3. Thus, the air gap 9 may expose a portion of the substrate 1. The air gap 9 may be surrounded by a top surface of the substrate 1, sidewalls of the adjacent patterns 3, and a bottom surface of the porous insulation layer 7. The air gap 9 may be filled with air.

According to example embodiments, a semiconductor device may include patterns 3 disposed on a substrate to be adjacent to each other and a porous insulation layer 7 disposed on the patterns 3. The porous insulation layer 7 may extend onto (or, alternatively, across) a space between the patterns 3 to provide an air gap 9 which is surrounded by the patterns 3, the porous insulation layer 7 and the substrate 1. Because the air gap 9 is filled with air, a dielectric constant of the air gap 9 may be remarkably lower than that of general insulation layers (e.g., a silicon oxide layer) which are widely known in the art. Thus, the air gap 9 may significantly reduce the parasitic capacitance between the adjacent patterns 3. That is, the air gap 9 may remarkably alleviate an interference effect between electrical signals induced or applied to the patterns 3.

Figure 4:
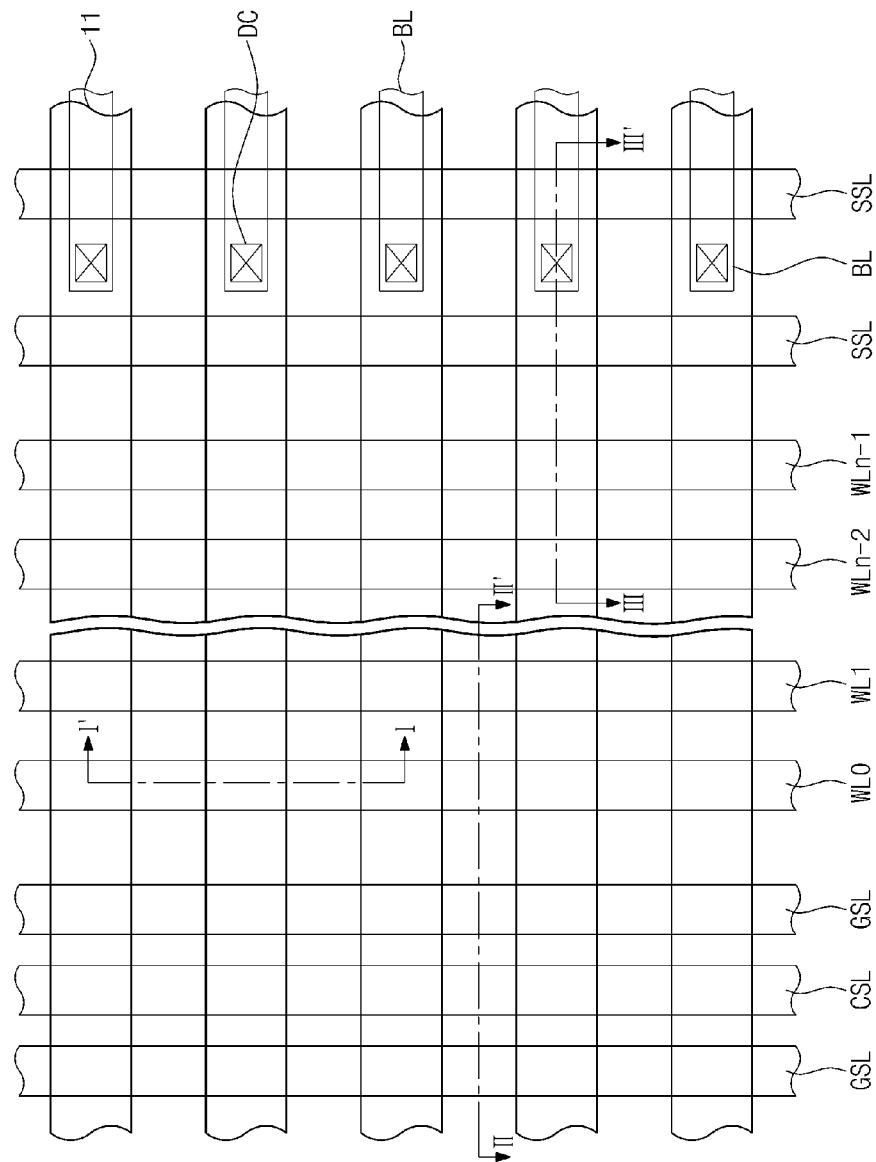
FIG. 4 illustrates an example of layout diagrams of semiconductor devices according to example embodiments.

FIG. 4 illustrates an example of layout diagrams of semiconductor devices according to example embodiments.

As illustrated in FIG. 4, memory cells of the semiconductor devices according to the present example embodiments may correspond to NAND-type nonvolatile memory cells.

Referring to FIG. 4, active regions 11 may extend in a first direction to be parallel with each other. String selection lines SSL and ground selection lines GSL may run across (or, alternatively, intersect) the active regions 11 to be parallel with each other. A plurality of word lines WL0 through WLn−1 may be disposed to cross the active regions 11 between the string selection line SSL and the ground selection line GSL adjacent to each other. The string selection lines SSL, the ground selection lines GSL and the word lines WL0 through WLn−1 may extend in a second direction intersecting the first direction. A common source line CSL may be disposed between the neighboring ground selection lines GSL to extend in the second direction. Bit lines BL may be disposed to extend in the first direction. The bit lines BL may be electrically connected to drain regions between the neighboring string selection lines SSL through bit line contacts DC. The string selection line SSL, the ground selection line GSL, and the word lines WL0-WLn−1 between the string and ground selection lines SSL and GSL may constitute a cell string group. The cell string group may be repeatedly arrayed in the first direction such that a pair of adjacent cell string groups is symmetrical to a straight line which is disposed between the pair of adjacent cell string groups to be parallel with the second direction.

Now, a method of fabrication a semiconductor device according to example embodiments will be described.

FIGS. 5 to 14 are drawings illustrating a method of fabricating a semiconductor device according to example embodiments.

Figure 5:
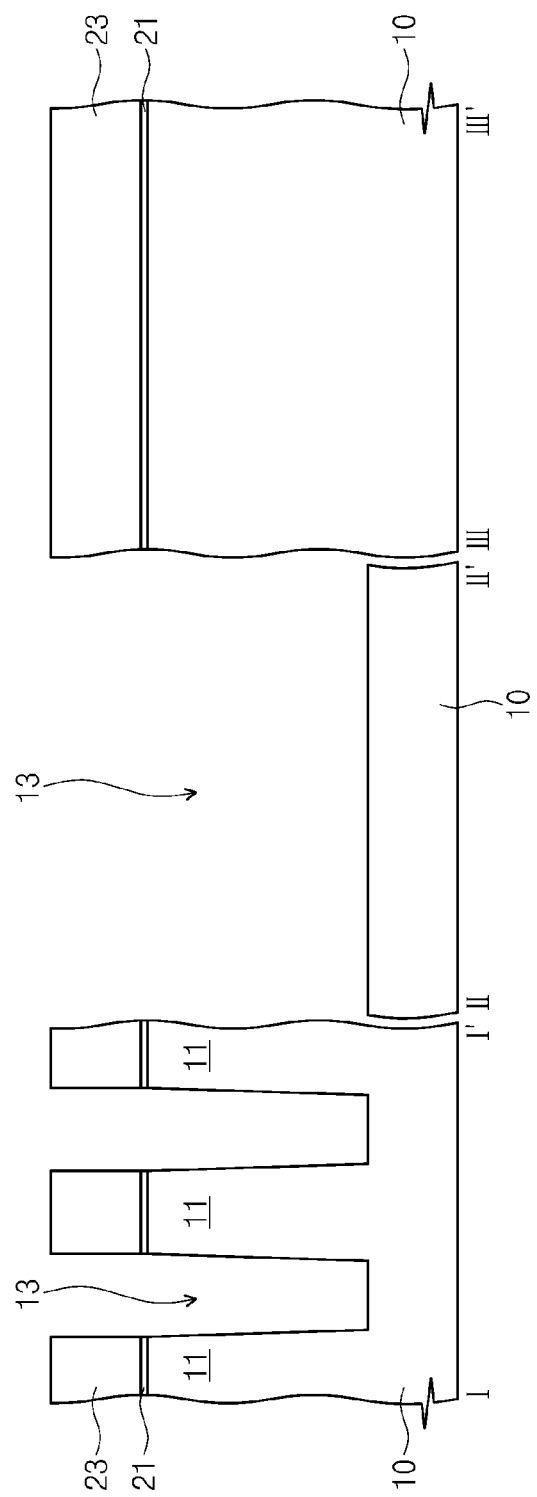
FIG. 5, FIG. 6 and FIGS. 8 to 14 are merged cross sectional views taken along lines I-I', II-II' and III-III' of FIG. 4 to illustrate a method of fabricating a semiconductor device according to example embodiments.
Figure 6:
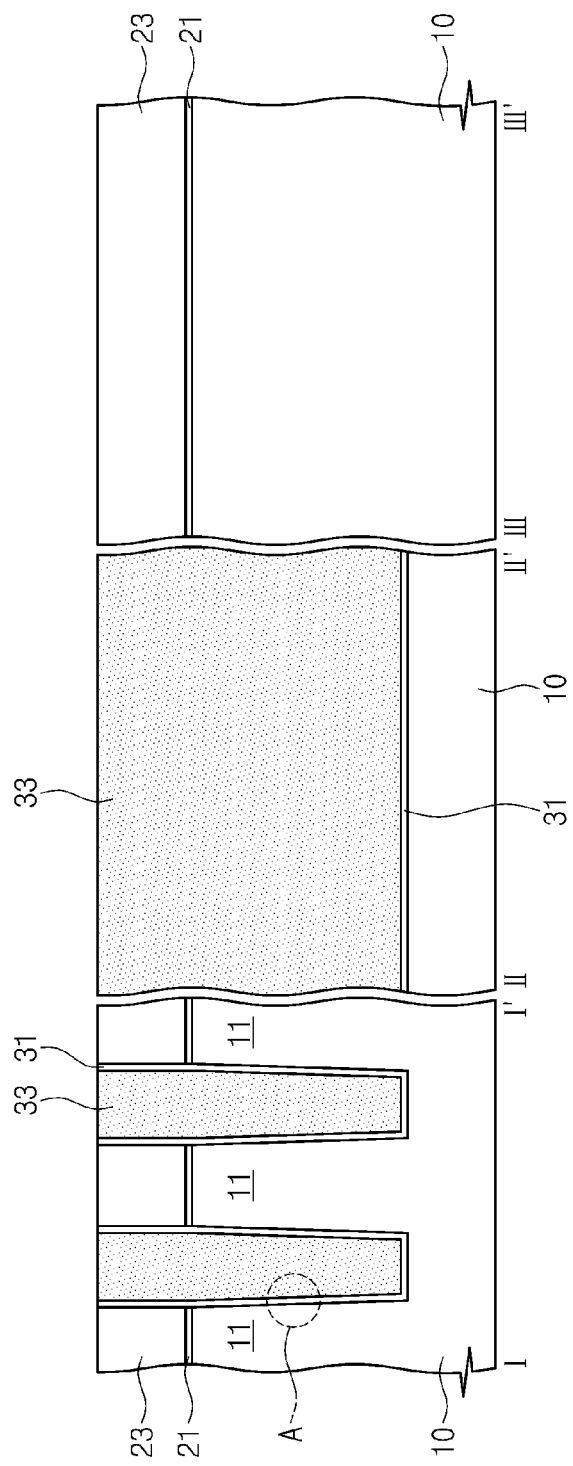
Figure 7:
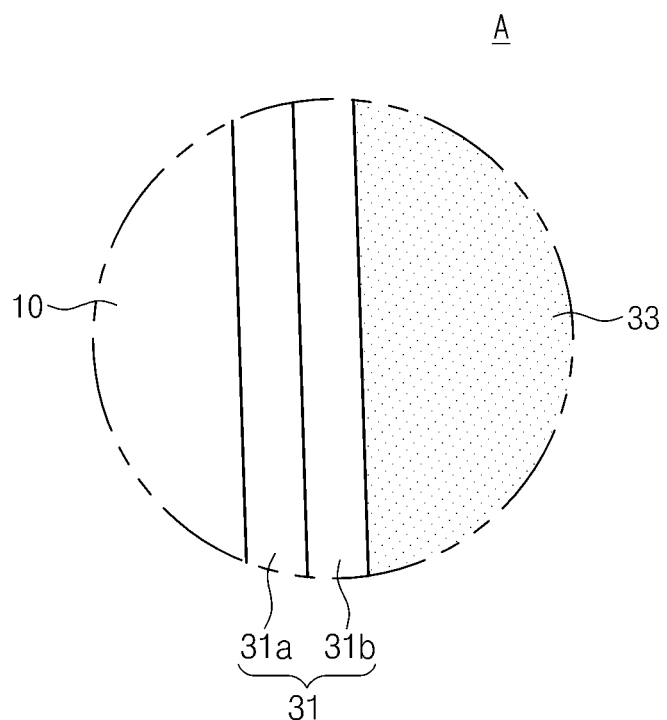
FIG. 7 is an enlarged view illustrating a portion 'A' of FIG. 6.

FIG. 5, FIG. 6 and FIGS. 8 to 14 are merged cross sectional views taken along lines I-I', II-II' and III-III' of FIG. 4, and FIG. 7 is an enlarged view illustrating a portion 'A' of FIG. 6.

Referring to FIG. 5, mask patterns 23 may be formed on a substrate 10. The substrate 10 may include one selected from the group consisting of a single crystalline silicon layer, a silicon on insulator (SOI) substrate, a silicon on silicon-germanium substrate, a single crystalline silicon on insulator substrate, and a polycrystalline silicon on insulator substrate. A buffer oxide layer 21 (corresponding to a pad oxide layer) may be formed between the substrate 10 and the mask patterns 23. Each of the mask patterns 23 may include a silicon nitride layer. The substrate 10 may be etched using the mask patterns 23 as etch masks, thereby forming a trench 13 in the substrate 10. The trench 13 may be formed under gap regions between the mask patterns 23. The trench 13 may define active regions 11 and may extend in the first direction described with reference to FIG. 4.

Referring to FIGS. 6 and 7, a liner insulation layer 31 may be formed on sidewalls and bottom surfaces of the trench 13. The liner insulation layer 31 may include a silicon oxide layer 31a formed on the sidewalls and the bottom surfaces of the trench 13 using a thermal oxidation process and a silicon nitride layer 31b (or a silicon oxynitride layer) formed on the silicon oxide layer 31a. The thermal oxidation process for forming the silicon oxide layer 31a may cure etch damage which is generated during formation of the trench 13. The silicon oxide layer 31a may be formed only on the exposed substrate 10, for example, only on the sidewalls and the bottom surface of the trench 13. That is, the silicon oxide layer 31a may not be formed on sidewalls of the mask patterns 23.

An insulating isolation layer 33 may be formed on the liner insulation layer 31 to fill the trench 13. The insulating isolation layer 33 may be formed of an insulation material having an etch selectivity with respect to the silicon nitride layer 31b. The insulating isolation layer 33 may be formed of an insulation material having an excellent gap filling property. The insulating isolation layer 33 may be a silicon oxide layer. The insulating isolation layer 33 may be a Tonen Silazane (TOSZ) layer formed using Tonen Silazane (TOSZ). The TOSZ layer may be a polysilazane layer. The TOSZ layer may be formed by coating the TOSZ material on the substrate having the liner insulation layer 31, supplying oxygen and water into the TOSZ material, and applying an annealing process to the TOSZ material to remove ammonia and hydrogen from the TOSZ material. As a result, the annealed TOSZ material may correspond to a silicon oxide layer. Alternatively, the insulating isolation layer 33 may be, for example, a silicon on glass (SOG) oxide layer, a high density plasma (HDP) oxide layer, an undoped silicate glass (USG) layer or a tetra-ethyl-orthosilicate (TEOS) layer. The insulating isolation layer 33 may be planarized using a chemical mechanical polishing (CMP) process. A top surface of the planarized insulating isolation layer 33 may be coplanar with a top surface of the mask patterns 23. The silicon nitride layer 31b may prevent the substrate 10 from being damaged during formation of the planarized insulating isolation layer 33.

Figure 8:
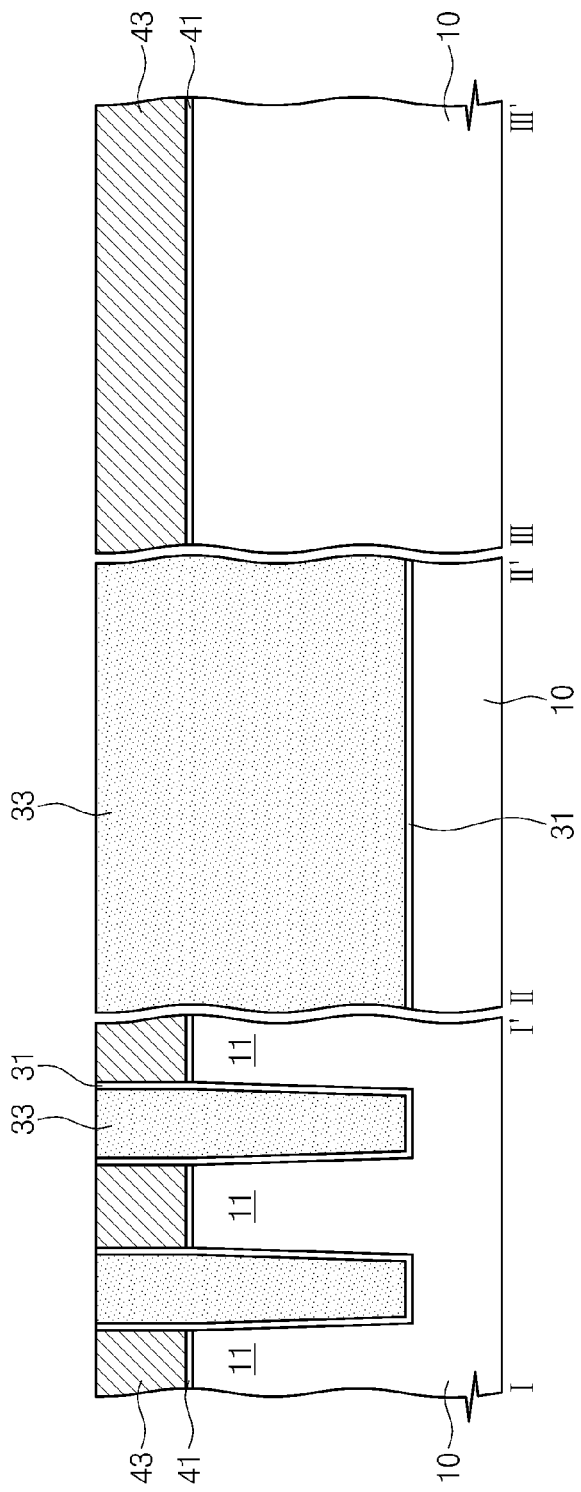

Referring to FIG. 8, the mask patterns 23 and the pad oxide layer 21 may be removed to expose the active regions 11. During removal of the mask patterns 23 and the pad oxide layer 21, portions of the liner insulation layer 31 adjacent to the mask patterns 23 may also be removed. Further, although not shown in the drawings, upper widths of the insulating isolation layer 33 adjacent to the mask patterns 23 may be reduced after removal of the mask patterns 23 and the pad oxide layer 21. A tunnel insulation layer 41 and a floating gate electrode 43 may be sequentially formed on each of the exposed active regions 11. The floating gate electrode 43 may be a charge storage layer in which charges are stored. The tunnel insulation layers 41 may be formed by thermally oxidizing the exposed active regions 11. The floating gate electrodes 43 may be formed of a doped polysilicon layer. The floating gate electrodes 43 may be formed by planarizing the doped polysilicon layer with a chemical mechanical polishing (CMP) process. Top surfaces of the floating gate electrodes 43 may be coplanar with the top surfaces of the insulating isolation layer 33.

Alternatively, the floating gate electrodes 43 may be formed using different methods from the methods described with reference to FIGS. 5 to 8. For example, tunnel insulation layers and floating gate electrodes may be formed on the substrate 10 instead of the pad oxide layers 21 and the mask patterns 23, respectively. The substrate 10 may be etched using the floating gate electrodes as etch masks, thereby forming the trench 13. Subsequently, the liner insulation layer 31 and the insulating isolation layer 33 may be formed using the same method as described with reference to FIG. 6. As a result, the structure illustrated in FIG. 8 can be obtained.

Figure 9:
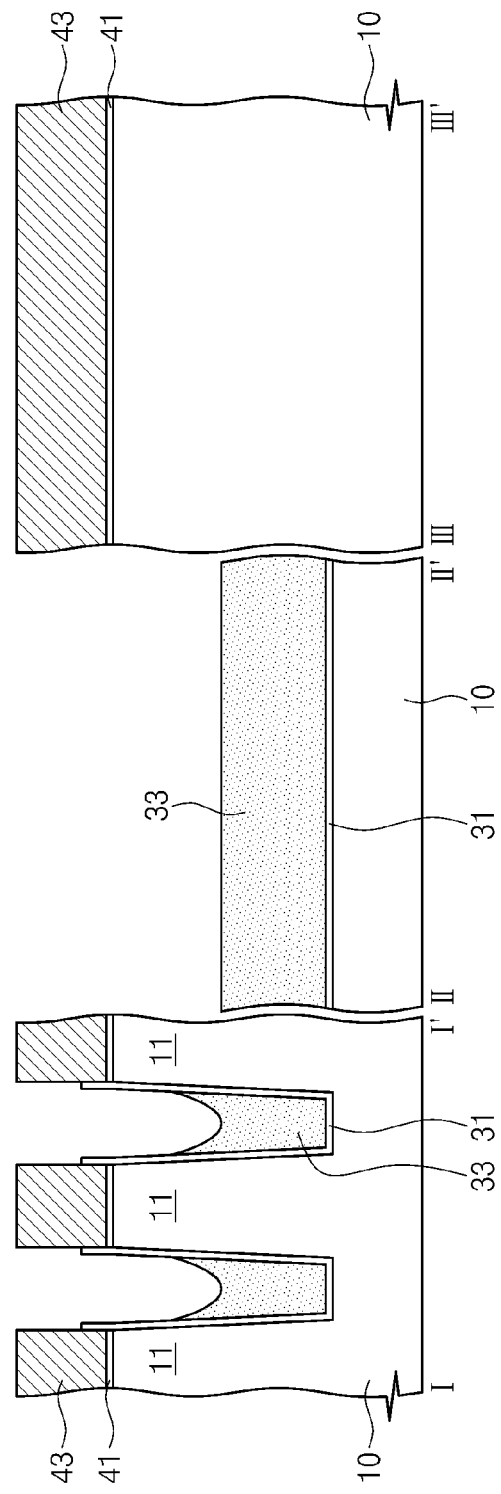

Referring to FIG. 9, the insulating isolation layer 33 may be recessed by removing an upper portion thereof. After the insulating isolation layer 33 is recessed, the recessed insulating isolation layer 33 may have a concave top surface. The insulating isolation layer 33 may be recessed using an etch-back process. A top surface of the recessed insulating isolation layer 33 may be located at a lower level than the top surfaces of the active regions 11. An upper portion of the liner insulation layer 31 may be removed during the etch-back process for recessing the insulating isolation layer 33.

Figure 10:
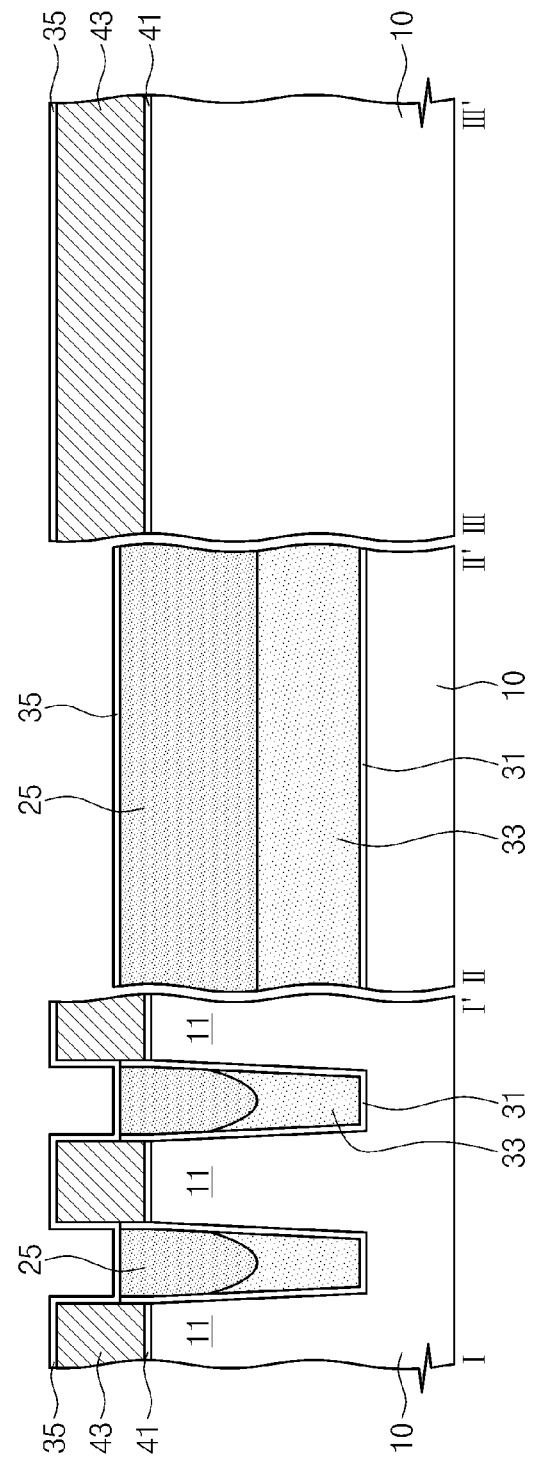

Referring to FIG. 10, a first sacrificial layer 25 may be formed on the recessed insulating isolation layer 33 to fill an upper portion of the trench 13. Preferably, the first sacrificial layer 25 may be formed of a material that is more readily removable as compared with the insulating isolation layer 33 and the liner insulation layer 31. That is, the first sacrificial layer 25 may have an etch selectivity with respect to the insulating isolation layer 33 and the liner insulation layer 31. As described with reference to FIG. 2, the first sacrificial layer 25 may be formed of a spin on hard mask (SOH) layer. The SOH layer may be an insulation layer of a hydrocarbon ($C_xH_y$) system. Alternatively, the first sacrificial layer 25, for example, may be formed of photoresist or amorphous silicon.

An upper portion of the first sacrificial layer 25 may be removed to recess the first sacrificial layer 25. A top surface of the recessed first sacrificial layer 25 may be located at a level between the top surfaces and the bottom surface of the floating gate electrodes 43. The first sacrificial layer 25 may be recessed using an etch-back process.

A first porous insulation layer 35 may be formed to cover the floating gate electrodes 43 and the recessed first sacrificial layer 25. The first porous insulation layer 35 may have a plurality of pores therein. The first porous insulation layer 35 may be a porous SiCOH (p-SiCOH) layer, as described with reference to FIG. 2.

Figure 11:
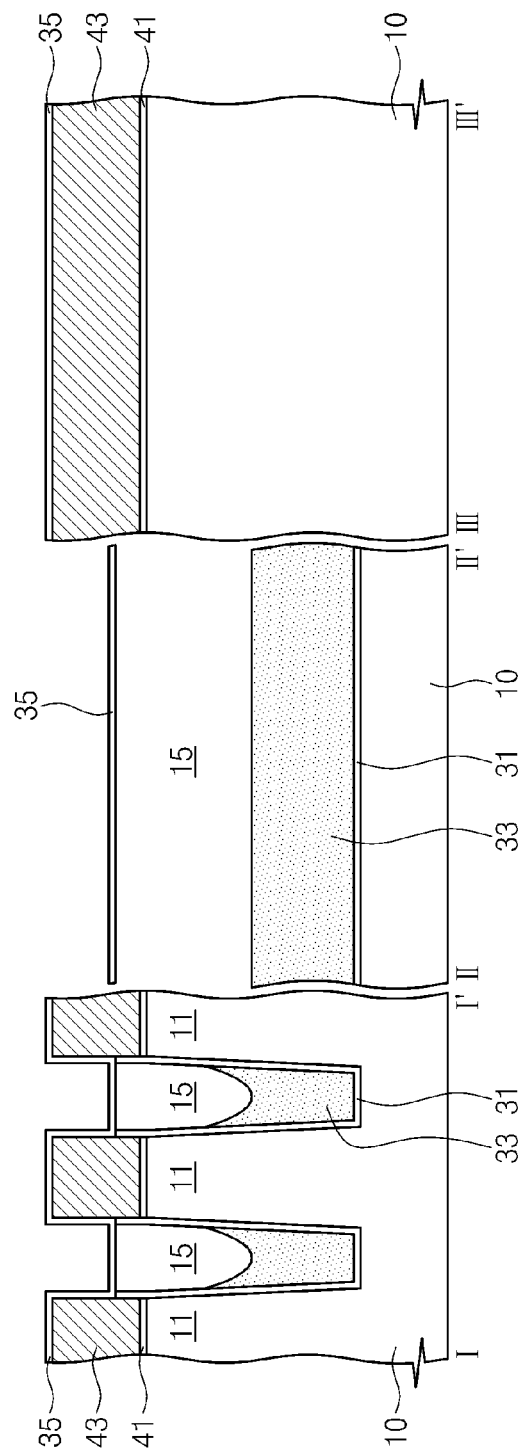

Referring to FIG. 11, the first sacrificial layer 25 may be selectively removed using a chemical gas or a wet etchant penetrating the first porous insulation layer 35 via the pores, as described with reference to FIG. 3. As a result of selective removal of the first sacrificial layer 25, a first air gap 15 extending in the first direction may be formed between the first porous insulation layer 35 and the insulating isolation layer 33. Thus, the first air gap 15 may expose a top surface of the insulating isolation layer 33. The first air gap 15 may be an empty space surrounded by a top surface of the insulating isolation layer 33, the liner insulation layer 31 and a bottom surface of the first porous insulation layer 35.

Figure 12:
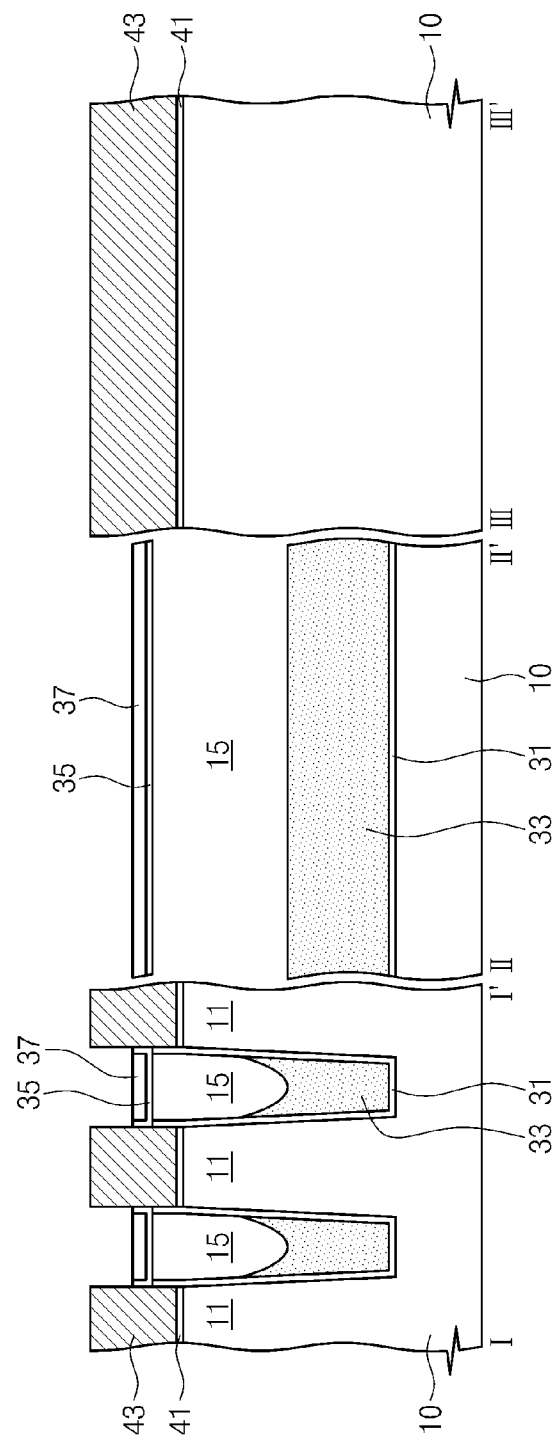

Referring to FIG. 12, a second sacrificial layer (not shown) may be formed on the first porous insulation layer 35. The second sacrificial layer may be formed to fill spaces between the floating gate electrodes 43. The second sacrificial layer may be formed of a silicon oxide layer having an excellent gap filling property (e.g., a spin on glass (SOG) layer). The second sacrificial layer and the first porous insulation layer 35 may be recessed to expose top surfaces and/or sidewalls of the floating gate electrodes 43. After the second sacrificial layer and the first porous insulation layer 35 are recessed, sacrificial patterns 37 may remain on the recessed first porous insulation layers 35, as illustrated in FIG. 12. Alternatively, after the second sacrificial layer and the first porous insulation layer 35 are recessed, the second sacrificial layer may be completely removed.

Figure 13:
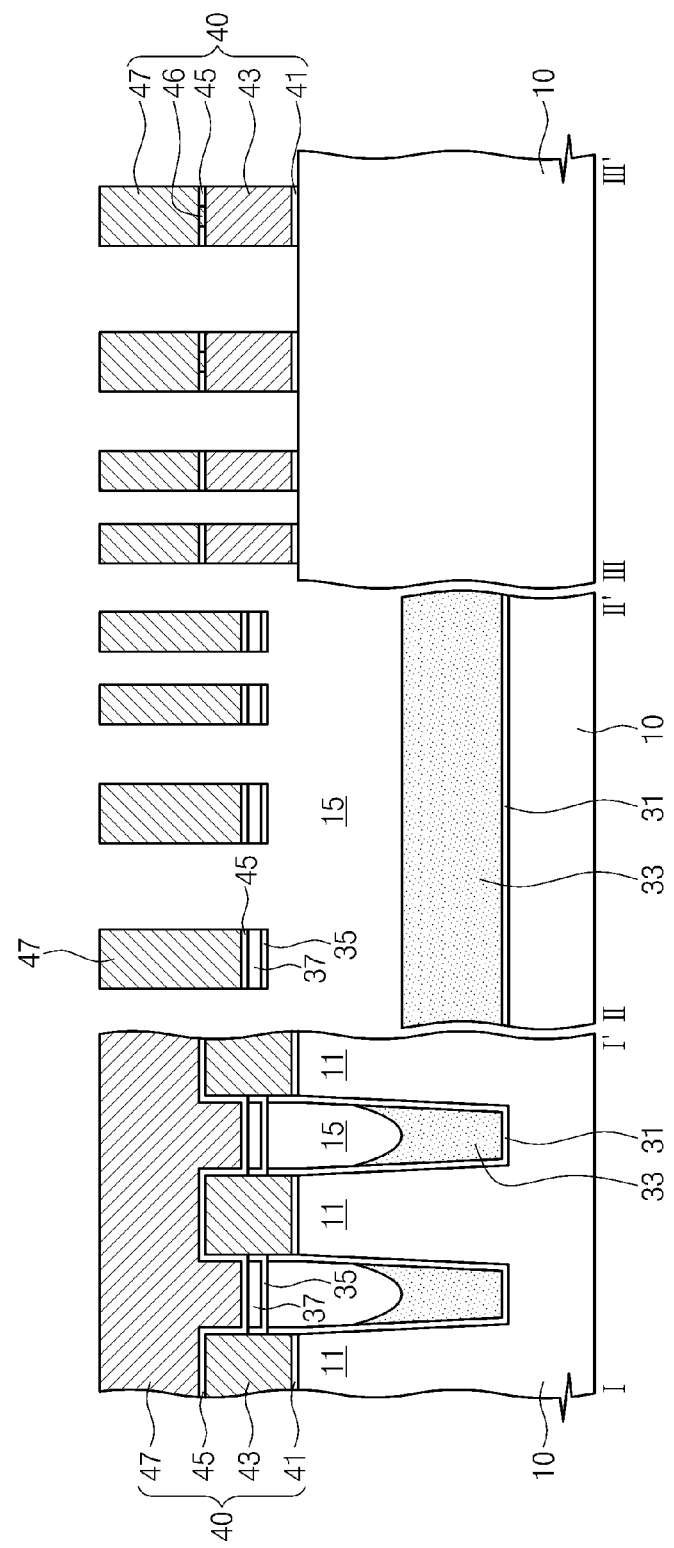

Referring to FIG. 13, an insulation layer and a conductive layer may be sequentially formed on the substrate including the recessed first porous insulation layers 35. The conductive layer, the insulation layer and the floating gate electrodes 43 may be successively patterned to form blocking insulation layers 45, control gate electrodes 47 on respective ones of the blocking insulation layers 45, and separated floating gate electrodes 43. The blocking insulation layers 45 and the control gate electrodes 47 may extend onto the first porous insulation layers 35. The control gate electrodes 47 may extend in the second direction intersecting the first direction, thereby crossing over the active regions 11. The control gate electrodes 47 may include the word lines WL0-WLn−1, the ground selection lines GSL and the string selection lines SSL described with reference to FIG. 4. The control gate electrodes 47 corresponding to the ground selection lines GSL and the string selection lines SSL may be electrically connected to the floating gate electrodes 43 thereunder through contacts 46.

The blocking insulation layers 45 may be formed of a material having a higher dielectric constant than the tunnel insulation layers 41. For example, the blocking insulation layers 45 may be formed of at least one of high-k dielectric layers (e.g., an oxide/nitride/oxide (ONO) layer, an aluminum oxide layer, a hafnium oxide layer, a hafnium aluminum oxide layer and a zirconium oxide layer). The control gate electrodes 47 may be formed of a doped polysilicon layer, a metal layer and/or a metal silicide layer. The tunnel insulation layer 41, the floating gate electrodes 43, the blocking insulation layer 45 and the control gate electrode 47, which are sequentially stacked on the substrate 10, may constitute a gate stack 40.

Figure 14:
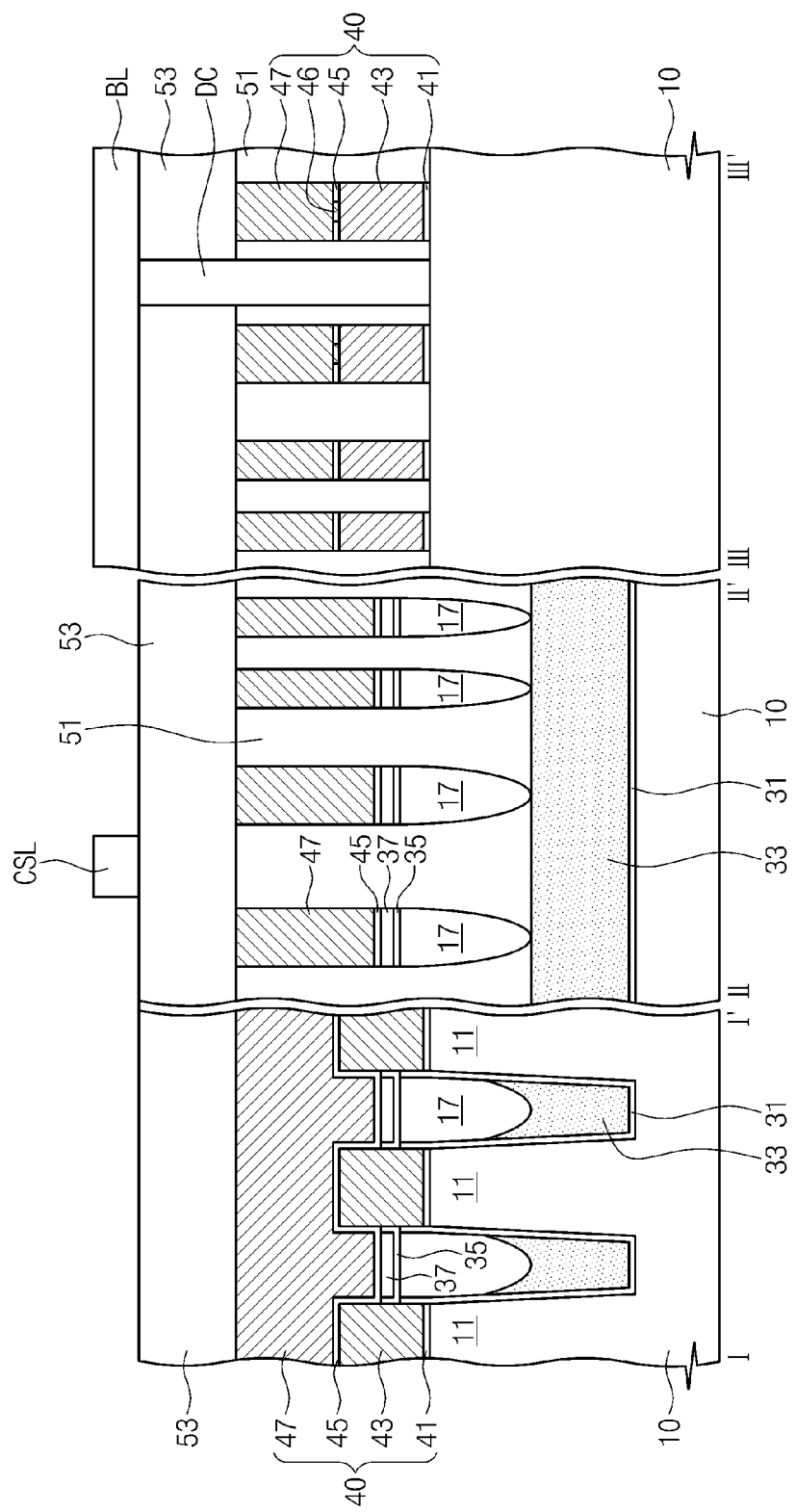

Referring to FIG. 14, a buried insulation layer 51 may be formed on an entire surface of the substrate including the gate stacks 40. The buried insulation layer 51 may be formed using an insulation layer having a poor step coverage characteristic and/or using a deposition process exhibiting a poor step coverage characteristic. The buried insulation layer 51 may be formed of a silicon oxide layer. The buried insulation layer 51 may fill empty spaces between the gate stacks 40 but may hardly fill portions of the first air gap 15 directly below the first porous insulation layers 35. Only a portion of the first air gap 15 below each of the first porous insulation layers 35 may be filled with the buried insulation layer 51. Thus, second air gaps 17 may be formed below respective ones of the recessed first porous insulation layers 35, and a lower width of the second air gaps 17 may be less than an upper width thereof. Each of the second air gaps 17 may be surrounded by a top surface of the insulating isolation layer 33, the liner insulation layer 31, the buried insulation layer 51 and a bottom surface of the first porous insulation layer 35. However, the second air gaps 17 may not limited to the aforementioned configuration. For example, the buried insulation layer 51 may be formed to cover the entire top surface of the insulating isolation layer 33. In this case, the second air gaps 17 may be spaced apart from the insulating isolation layer 33 by the buried insulation layer 51.

A first interlayer insulation layer 53 may be formed on the buried insulation layer 51 and the control gate electrodes 47. The first interlayer insulation layer 53 may be formed of a silicon oxide layer. Bit lines BL and a common source line CSL may be formed on the first interlayer insulation layer 53. The bit lines BL may be connected to drain regions between the neighboring string selection lines SSL through bit line contacts DC penetrating the first interlayer insulation layer 53 and the buried insulation layer 51. The common source line CSL may be connected to source regions between the neighboring ground selection lines GSL through contacts having a similar configuration to the bit line contacts DC (refer to FIG. 4).

A semiconductor device according to example embodiments will now be described with reference to FIGS. 14 and 15.

Figure 15:
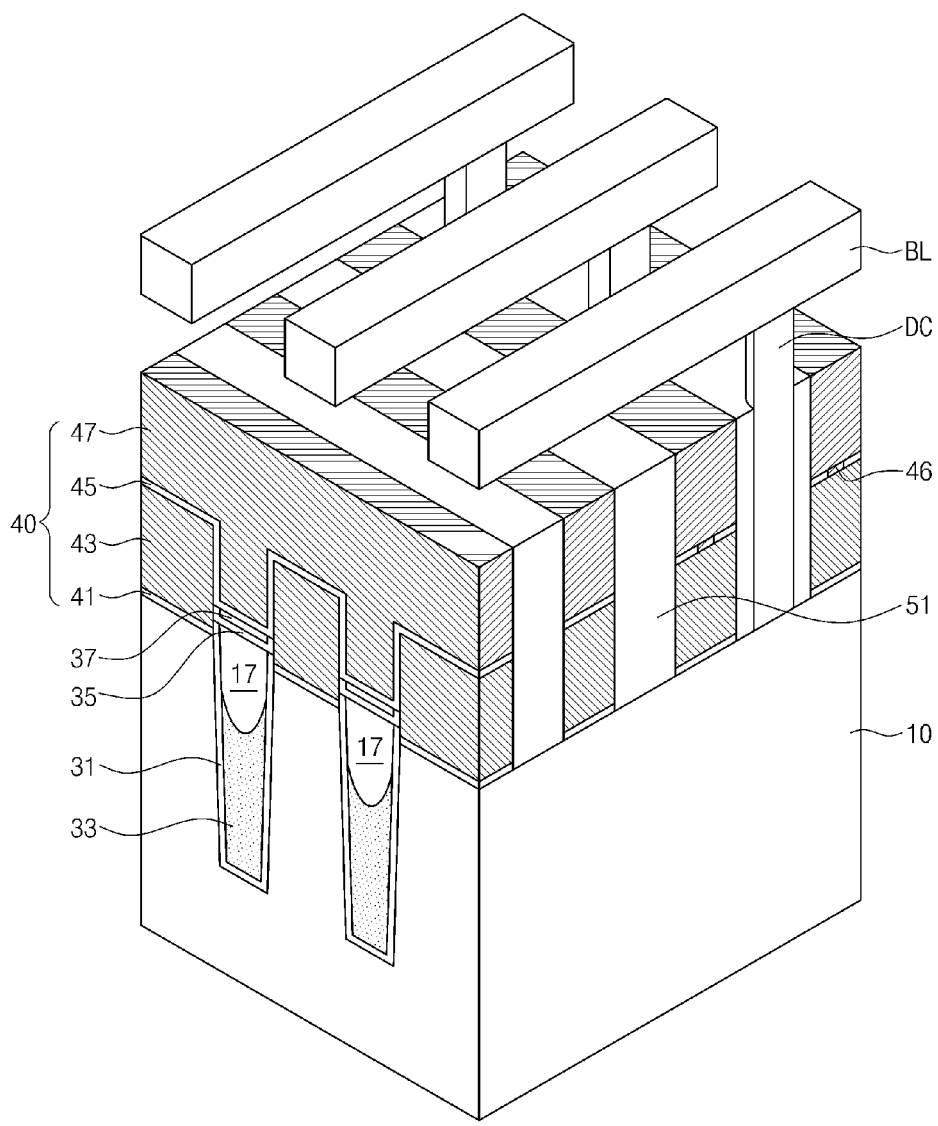
FIG. 15 is a perspective view relating to FIG. 14.

FIG. 15 is a perspective view relating to FIG. 14.

Referring to FIGS. 14 and 15, the semiconductor device may include a substrate 10 having a trench 13 and an insulating isolation layer 33 filling a lower portion of the trench 13. The trench 13 may define a plurality of active regions 11 extending in a first direction.

The insulating isolation layer 33 may include a material having an excellent gap filling property. The insulating isolation layer 33 may be a silicon oxide layer. The insulating isolation layer 33 may be a polysilazane layer, a silicon on glass (SOG) oxide layer, a high density plasma (HDP) oxide layer, an undoped silicate glass (USG) layer or a tetra-ethyl-ortho-silicate (TEOS) layer. The insulating isolation layer 33 may have a concave top surface. A liner insulation layer 31 may be provided on a sidewall and a bottom surface of the trench 13. The liner insulation layer 31 may be disposed between the insulating isolation layer 33 and the inner surface of the trench 13. The liner insulation layer 31 may include a silicon oxide layer 31a and a silicon nitride layer 31b (or a silicon oxynitride layer) on the silicon oxide layer 31a (refer to FIG. 7).

A tunnel insulation layer 41 may be provided on the active regions 11. The tunnel insulation layer 41 may be a thermal oxide layer. Floating gate electrodes 43 may be provided on the tunnel insulation layer 41. Each of the floating gate electrodes 43 may be a doped polysilicon layer.

First porous insulation layers 35 may be disposed between the floating gate electrodes 43 and may be upwardly spaced apart from a top surface of the insulating isolation layer 33. Each of the first porous insulation layers 35 may be a porous SiCOH (p-SiCOH) layer including a plurality of pores therein, and each of the pores may have a size (e.g., a diameter) of about several ten nanometers (nm). The first porous insulation layers 35 may be located at a level between top surfaces and bottom surface of the floating gate electrodes 43. The liner insulation layer 31 may extend to contact bottom surfaces of the first porous insulation layers 35.

Control gate electrodes 47 may be provided on the floating gate electrodes 43. The control gate electrodes 47 may extend onto the first porous insulation layers 35. Blocking insulation layers 45 may be disposed between the control gate electrodes 47 and the floating gate electrodes 43. The blocking insulation layers 45 may be a high-k dielectric layer having a higher dielectric constant than the tunnel insulation layer 41. For example, the blocking insulation layers 45 may include at least one of an oxide/nitride/oxide (ONO) layer, an aluminum oxide layer, a hafnium oxide layer, a hafnium aluminum oxide layer and a zirconium oxide layer. Each of the control gate electrodes 47 may include a doped polysilicon layer and/or a metal silicide layer. Each of the control gate electrodes 47 may further include a capping pattern (not shown) formed thereon. The control gate electrodes 47 may include the word lines WL0-WLn−1, the ground selection lines GSL and the string selection lines SSL described with reference to FIG. 4.

Sacrificial patterns 37 may be disposed between the first porous insulation layers 35 and the control gate electrodes 47. Each of the sacrificial patterns 37 may include a material having an excellent gap filling property. For example, each of the sacrificial patterns 37 may be a spin on glass (SOG) layer.

The tunnel insulation layer 41, the floating gate electrodes 43, the blocking insulation layer 45 and the control gate electrode 47, which are sequentially stacked on the substrate 10, may constitute a gate stack 40. A buried insulation layer 51 may fill spaces between the gate stacks 40. The buried insulation layer 51 may be a silicon oxide layer. Second air gaps 17 corresponding to empty spaces may be provided below respective ones of the first porous insulation layers 35. Each of the second air gaps 17 may be surrounded by a top surface of the insulating isolation layer 33, the liner insulation layer 31, the buried insulation layer 51 and a bottom surface of the first porous insulation layer 35. However, the second air gaps 17 may not limited to the aforementioned configuration. For example, the buried insulation layer 51 may cover the entire top surface of the insulating isolation layer 33. In this case, the second air gaps 17 may be spaced apart from the insulating isolation layer 33 by the buried insulation layer 51. Lower portions of the second air gaps 17 may be narrower than upper portions thereof.

A first interlayer insulation layer 53 may be provided on the buried insulation layer 51 and the control gate electrodes 47. The first interlayer insulation layer 53 may be a silicon oxide layer. Bit lines BL and a common source line CSL may be provided on the first interlayer insulation layer 53. The bit lines BL may be connected to drain regions between the neighboring string selection lines SSL through bit line contacts DC penetrating the first interlayer insulation layer 53 and the buried insulation layer 51. The common source line CSL may be connected to source regions between the neighboring ground selection lines GSL through contacts having a similar configuration to the bit line contacts DC (refer to FIG. 4).

According to example embodiments, because the second air gaps 17 between the active regions 11 are filled with air, a dielectric constant of the second air gaps 17 may be lower than that of a silicon oxide layer. Thus, the second air gaps 17 may significantly reduce the parasitic capacitance between memory cells (e.g., active regions 11) adjacent to each other. That is, the second air gaps 17 may minimize an interference effect between the adjacent memory cells.

Now, a method of fabrication a semiconductor device according to other example embodiments will be described.

FIGS. 16 to 19 are drawings illustrating a method of fabricating a semiconductor device according to example embodiments.

FIGS. 16 to 19 are merged cross sectional views taken along lines I-I', II-II' and III-III' of FIG. 4.

Figure 16:
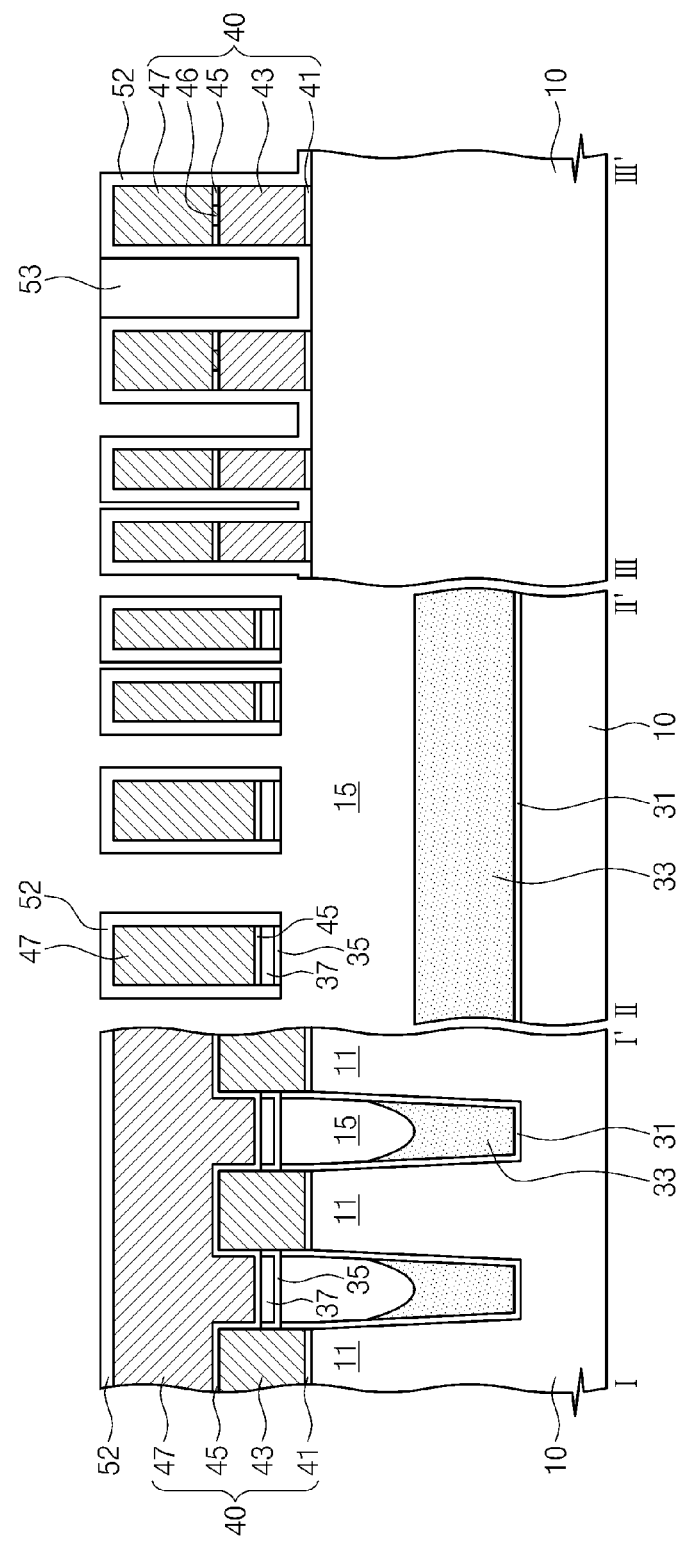
FIGS. 16 to 19 are merged cross sectional views taken along lines I-I', II-II' and III-III' of FIG. 4 to illustrate a method of fabricating a semiconductor device according to example embodiments.

Referring to FIG. 16, a spacer layer 52 may be formed on the substrate including the gate stacks 40, which is described with reference to FIGS. 5 to 13. The spacer layer 52 may be conformally formed not to fill spaces between the gate stacks 40. The spacer layer 52 may be formed of a silicon oxide layer, a silicon nitride layer or a silicon oxynitride layer. Although not shown in the drawings, a portion the spacer layer 52 may be formed on the insulating isolation layer 33.

First mask layers 53 may be formed on the spacer layer 52 between the pair of neighboring string selection lines SSL and the spacer layer 52 between the pair of neighboring ground selection lines GSL. The first mask layers 53 may be formed of photoresist. For example, the first mask layers 53 may be formed by coating a photoresist layer on the substrate, and patterning the photoresist layer using an exposure process to leave some portions of the photoresist layer only in spaces between the neighboring string selection lines SSL and between the neighboring ground selection lines GSL.

Figure 17:
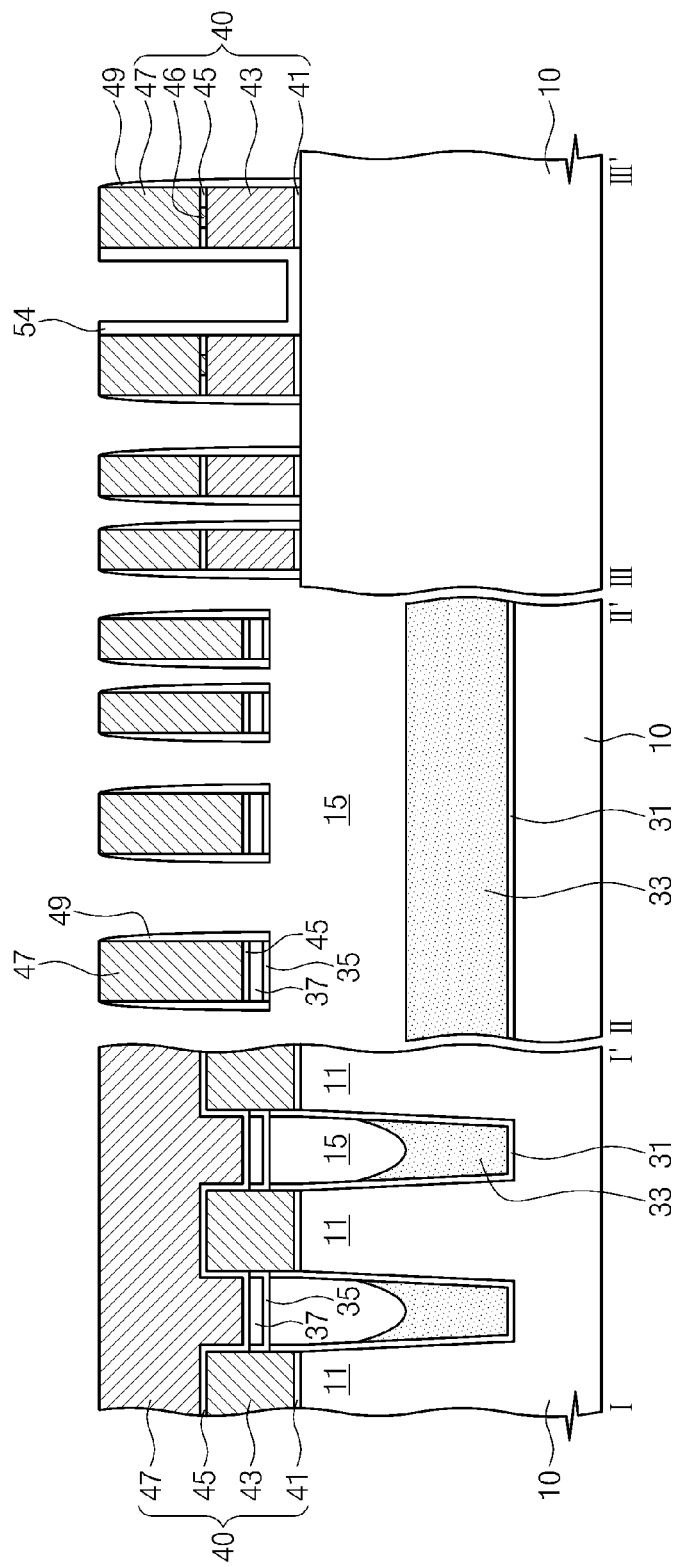

Referring to FIG. 17, sidewall spacers 49 may be formed on sidewalls of the gate stacks 40. The sidewall spacers 49 may be formed by etching back the spacer layer 52 using the first mask layers 53 as etch masks. During the etch-back process, the spacer layer 52 between the neighboring string selection lines SSL and between the neighboring ground selection lines GSL may be covered with the first mask layers 53. Thus, as a result of the etch-back process, insulation spacer layers 54 having a 'U'-shaped cross section may be formed between the neighboring string selection lines SSL and between the neighboring ground selection lines GSL. The first mask layers 53 may be then removed.

Figure 18:
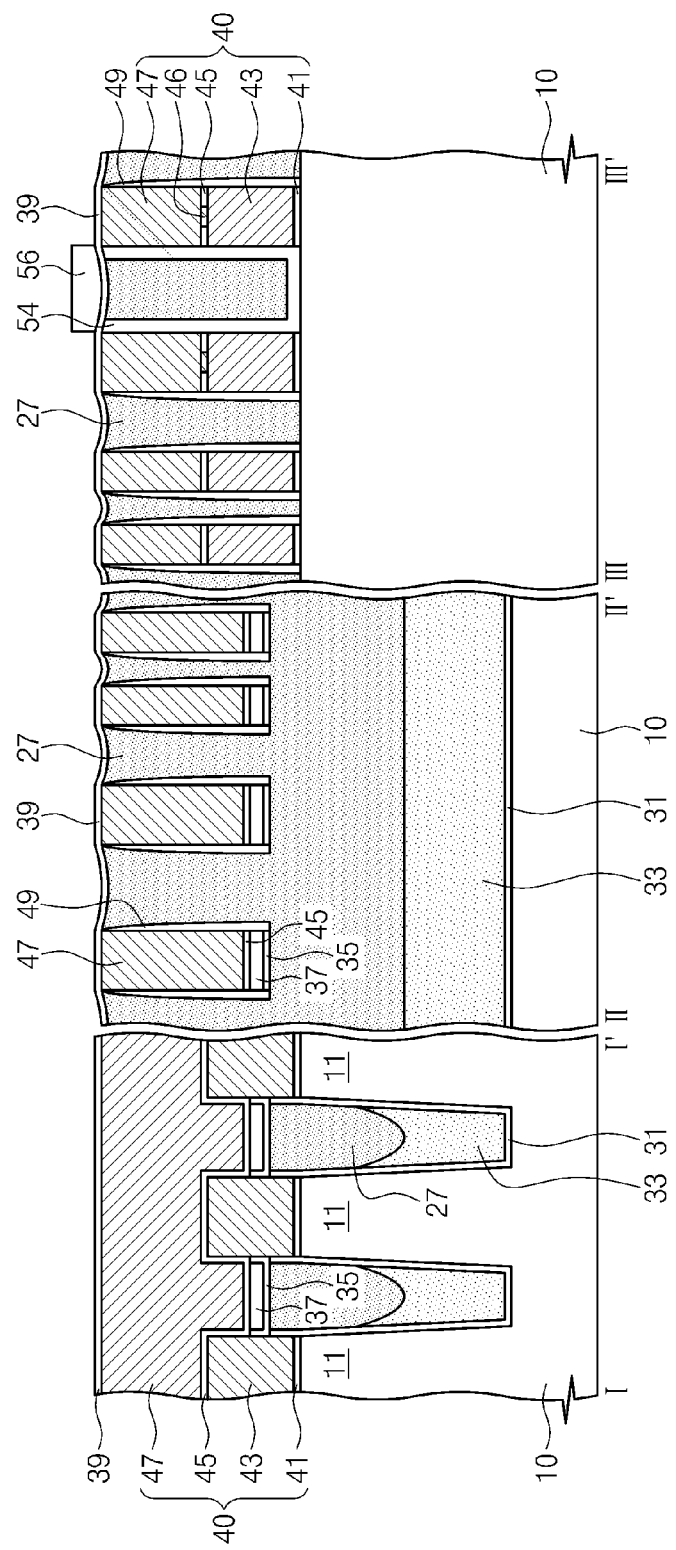

Referring to FIG. 18, a third sacrificial layer 27 may be formed to fill the first air gap 15 and spaces between the gate stacks 40. The third sacrificial layer 27 may be formed of a material that is more readily removable as compared with the liner insulation layer 31 and the insulating isolation layer 33. That is, the third sacrificial layer 27 may have an etch selectivity with respect to the liner insulation layer 31, the insulating isolation layer 33 and the sidewall spacers 49. The third sacrificial layers 27 may be formed using substantially the same method as described with reference to FIG. 2. The third sacrificial layer 27 may be planarized to expose top surfaces of the control gate electrodes 47. The planarization process may be performed using a chemical mechanical polishing (CMP) process. During the planarization process, the third sacrificial layer 27 between the gate stacks 40 may be recessed. Thus, the third sacrificial layer 27 between the gate stacks 40 may be formed to have a top surface which is located at a lower level than a top surface of the gate stacks 40.

A second porous insulation layer 39 having a plurality of pores may be formed on the control gate electrodes 47 and the third sacrificial layer 27. The second porous insulation layer 39 may be formed using substantially the same method as described with reference to FIG. 2.

Second mask layers 56 may be formed on the second porous insulation layer 39. The second mask layers 56 may be formed over respective ones of the insulation spacer layers 54 which are disposed between the neighboring string selection lines SSL and between the neighboring ground selection lines GSL. The second mask layers 56 may block paths that penetrate the second porous insulation layer 39 via the pores. The second mask layers 56 may be formed of a silicon oxide layer.

Figure 19:
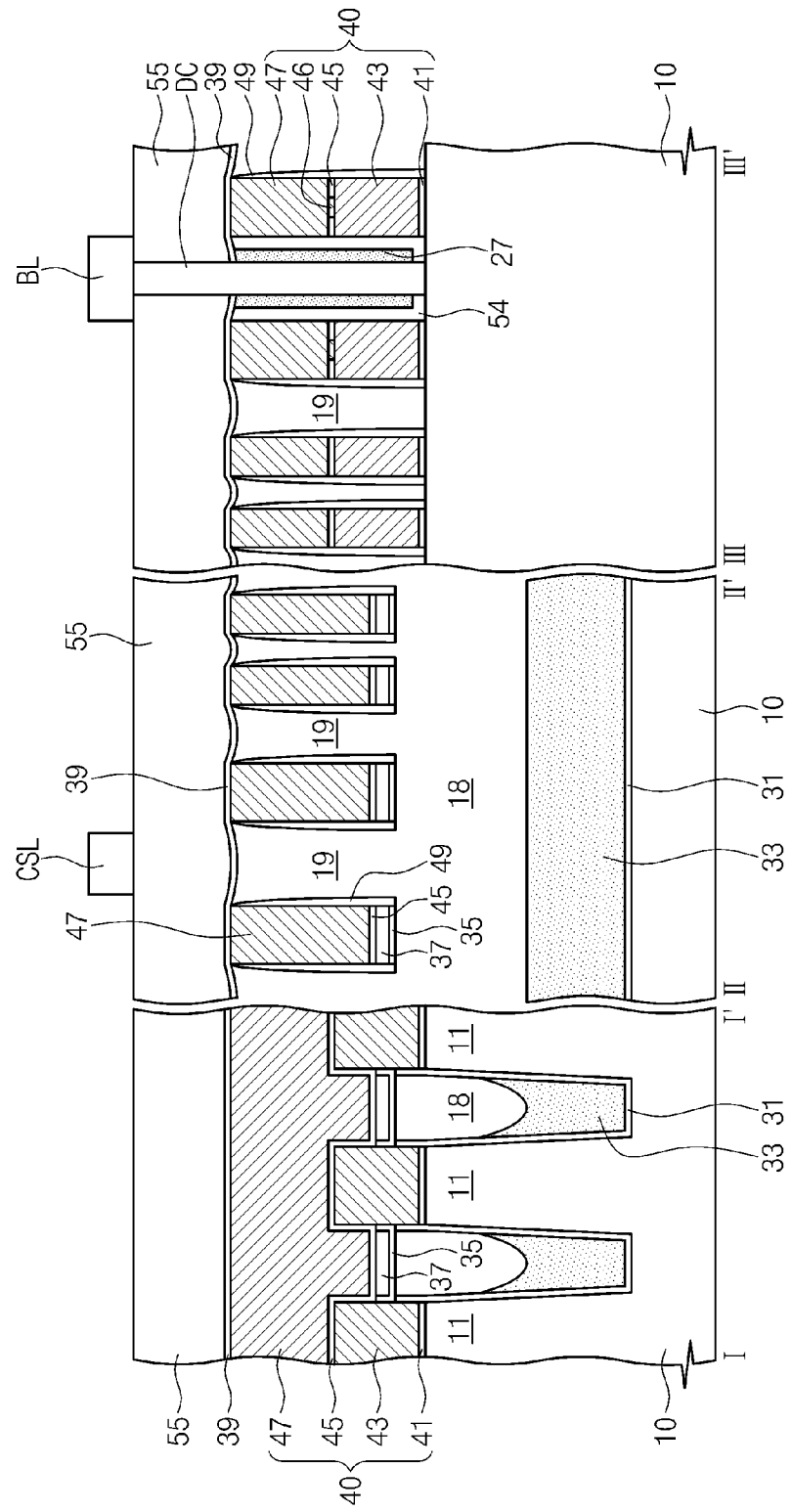

Referring to FIG. 19, the third sacrificial layer 27 may be selectively removed using a chemical gas or a wet etchant penetrating the second porous insulation layer 39 via the pores. The third sacrificial layer 27 may be selectively removed using substantially the same method as described with reference to FIG. 3. Thus, third air gaps 18 and fourth air gaps 19 may be simultaneously formed. Each of the third air gaps 18 may have a similar shape to each of the first air gaps 15 illustrated in FIG. 17. That is, each of the third air gaps 18 may be an empty space that is surrounded by a top surface of the insulating isolation layer 33, the liner insulation layer 31 and a bottom surface of the first porous insulation layer 35 to extend in a first direction. Each of the fourth air gaps 19 may be an empty space that is disposed between the pair of adjacent gate stacks 40 to extend in a second direction intersecting the first direction. The fourth air gaps 19 may be located below the second porous insulation layer 39. The fourth air gaps 19 may be spatially connected to the third air gaps 18. Because of the presence of the second mask layers 56, the third sacrificial layers 27 between the neighboring string selection lines SSL and between the neighboring ground selection lines GSL may remain even after the third and fourth air gaps 18 and 19 are formed.

A second interlayer insulation layer 55 may be formed on the second porous insulation layer 39. The second interlayer insulation layer 55 may be a silicon oxide layer. The second interlayer insulation layer 55 may include the second mask layers 56. Thus, the second mask layers 56 may not be illustrated in FIG. 19 even though the second mask layers 56 are not removed. Bit lines BL and a common source line CSL may be formed on the second interlayer insulation layer 55. The bit lines BL may be connected to drain regions between the neighboring string selection lines SSL through bit line contacts DC penetrating the second interlayer insulation layer 55, the second porous insulation layer 39, the third sacrificial layer 27 and the insulation spacer layers 54. The common source line CSL may be connected to source regions between the neighboring ground selection lines GSL through contacts having a similar configuration to the bit line contacts DC (refer to FIG. 4).

A semiconductor device according to another example embodiment will now be described with reference to FIGS. 19 and 20.

Figure 20:
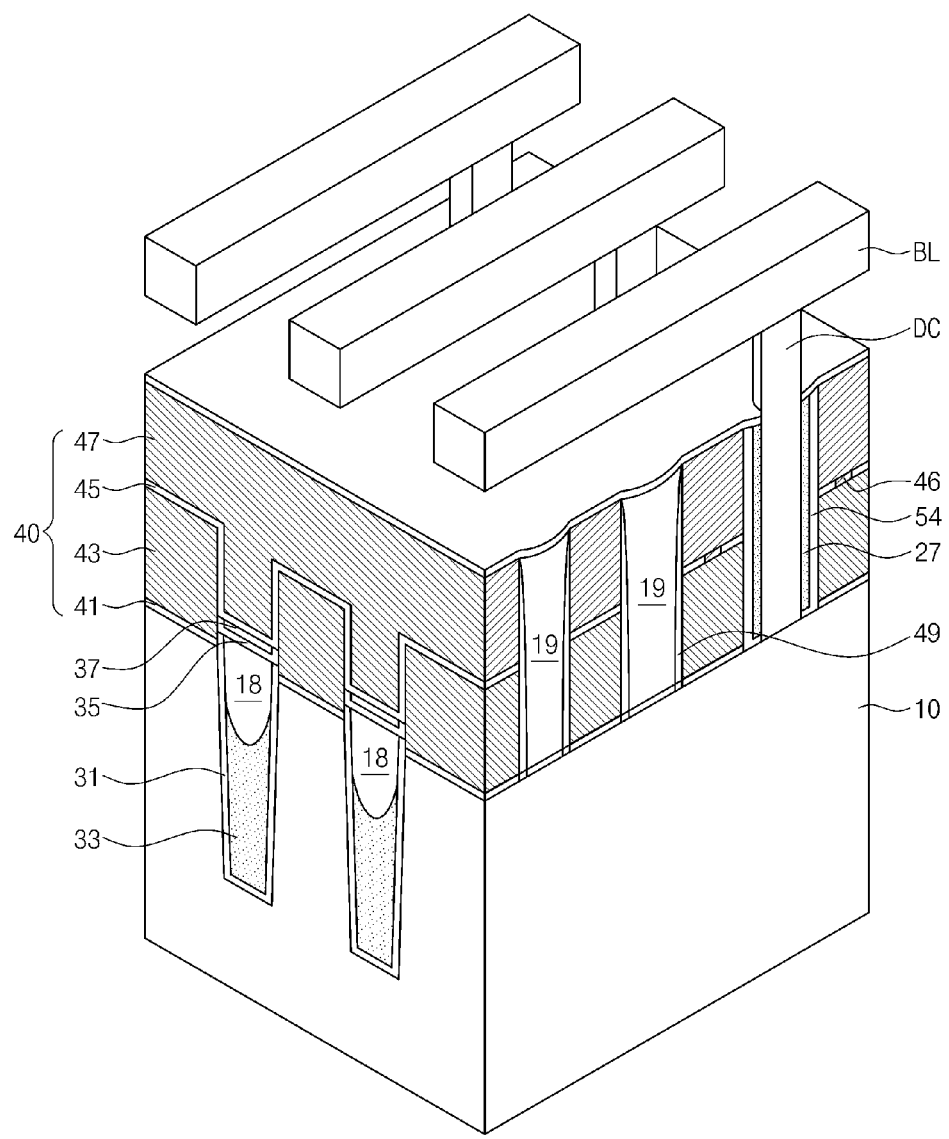
FIG. 20 is a perspective view relating to FIG. 19.

FIG. 20 is a perspective view relating to FIG. 19. For the purpose of simplification in explanation, differences between the present example embodiments and the previous example embodiments illustrated in FIGS. 14 and 15 will be mainly described in detail hereinafter.

Referring to FIGS. 19 and 20, sidewall spacers 49 may be provided on sidewalls of the gate stacks 40. Insulation spacer layers 54 may be provided between the neighboring string selection lines SSL and between the neighboring ground selection lines GSL. The sidewall spacers 49 and the insulation spacer layers 54 may be the same material. For example, each of the sidewall spacers 49 and the insulation spacer layers 54 may be a silicon oxide layer, a silicon nitride layer or a silicon oxynitride layer. Third sacrificial layers 27 may be disposed on respective ones of the insulation spacer layers 54 between the neighboring string selection lines SSL and between the neighboring ground selection lines GSL. Each of the third sacrificial layers 27 may be a silicon oxide layer having an etch selectivity with respect to the insulation spacer layers 54.

A second porous insulation layer 39 may be disposed on the gate stacks 40. The second porous insulation layer 39 may extend to cover spaces between the gate stacks 40. At least a bottom surface of the second porous insulation layer 39 between the gate stacks 40 may be located at a lower level than top surfaces of the gate stacks 40.

Third air gaps 18 may be provided between the insulating isolation layer 33 and the first porous insulation layers 35. Each of the third air gaps 18 may be an empty space that is surrounded by a top surface of the insulating isolation layer 33, the liner insulation layer 31 and a bottom surface of the first porous insulation layer 35 to extend in a first direction. Fourth air gaps 19 may be provided between the gate stacks 40 to extend in a second direction intersecting the first direction. The fourth air gaps 19 may be located below the second porous insulation layer 39. The fourth air gaps 19 may be spatially connected to the third air gaps 18.

A second interlayer insulation layer 55 may be provided on the second porous insulation layer 39. The second interlayer insulation layer 55 may be a silicon oxide layer. Bit lines BL and a common source line CSL may be provided on the second interlayer insulation layer 55. The bit lines BL may be connected to drain regions between the neighboring string selection lines SSL through bit line contacts DC penetrating the second interlayer insulation layer 55, the second porous insulation layer 39, the third sacrificial layer 27 and the insulation spacer layers 54. The common source line CSL may be connected to source regions between the neighboring ground selection lines GSL through contacts having a similar configuration to the bit line contacts DC (refer to FIG. 4).

According to example embodiments, because the third air gaps 18 and the fourth air gaps 19 are filled with air, dielectric constants of the third and fourth air gaps 18 and 19 may be lower than a dielectric constant of a silicon oxide layer. Thus, the third air gaps 18 may significantly reduce the parasitic capacitance between memory cells (e.g., active regions 11) adjacent to each other. That is, the third air gaps 18 may minimize an interference effect between the adjacent memory cells. Further, the fourth air gaps 19 may significantly reduce the parasitic capacitance between the adjacent floating gate electrodes 43 and/or between the adjacent control gate electrodes 47. Thus, the fourth air gaps 19 may also minimize an interference effect between the adjacent memory cells.

Now, a method of fabrication a semiconductor device according to yet other example embodiments will be described.

FIGS. 21 to 29 are drawings illustrating a method of fabricating a semiconductor device according to example embodiments.

Figure 23:
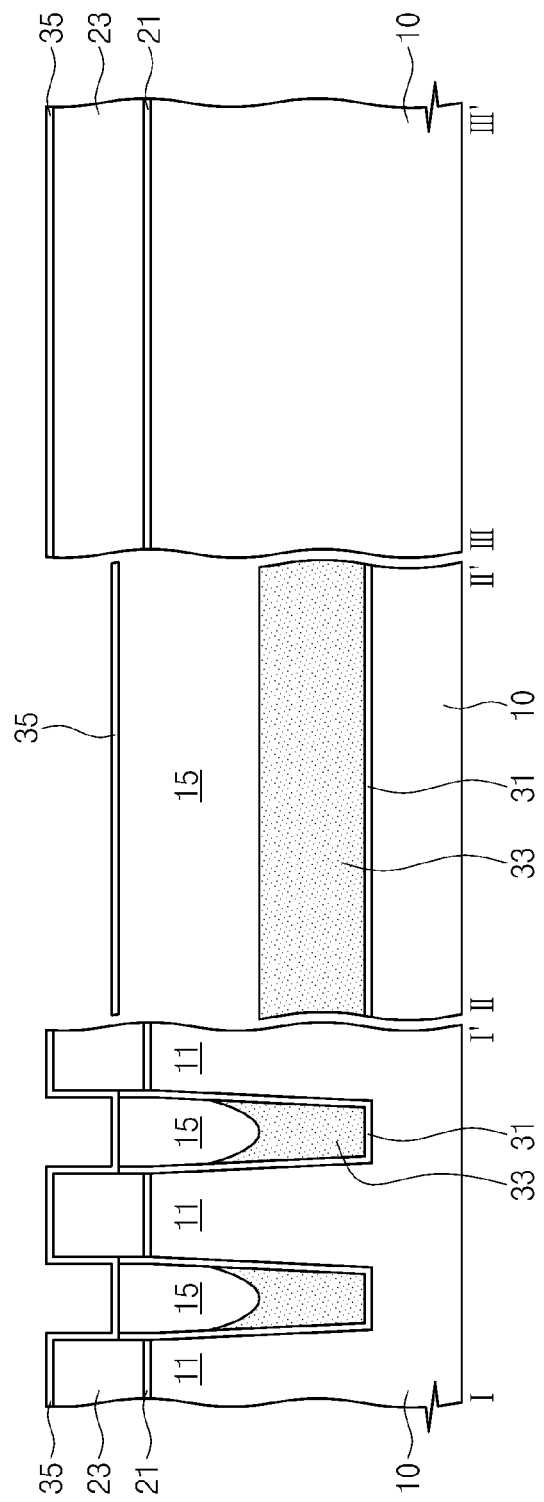
Figure 24:
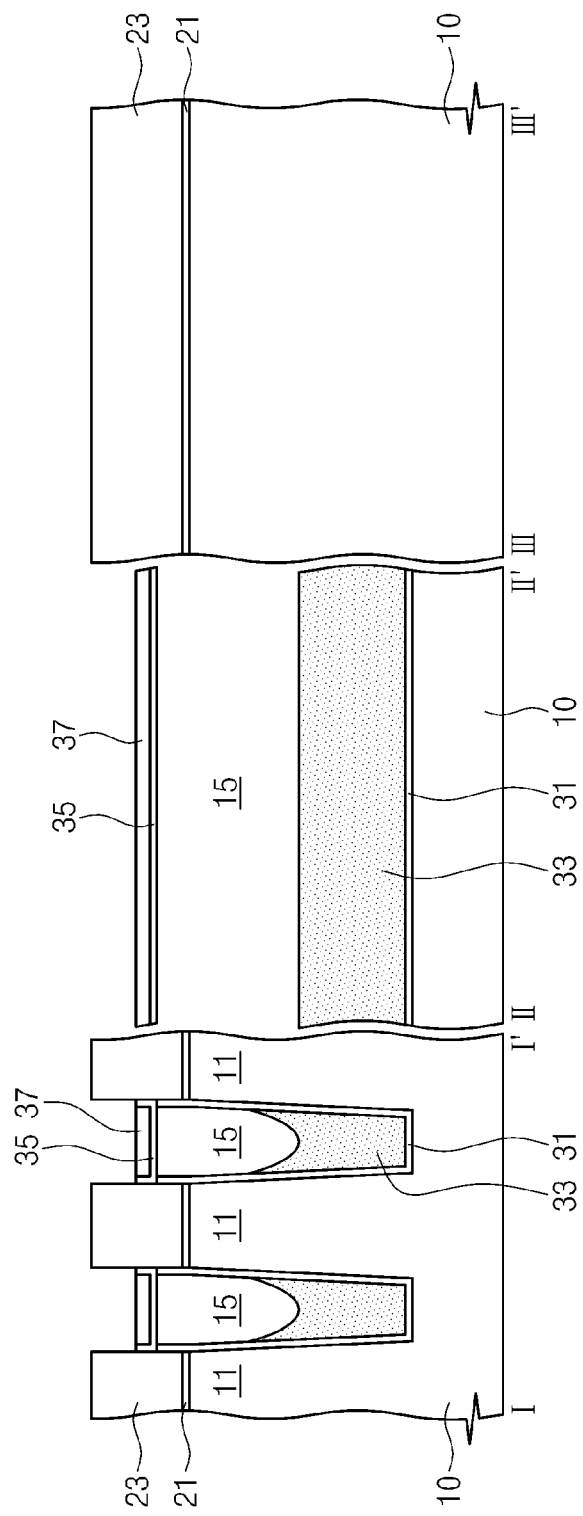
Figure 25:
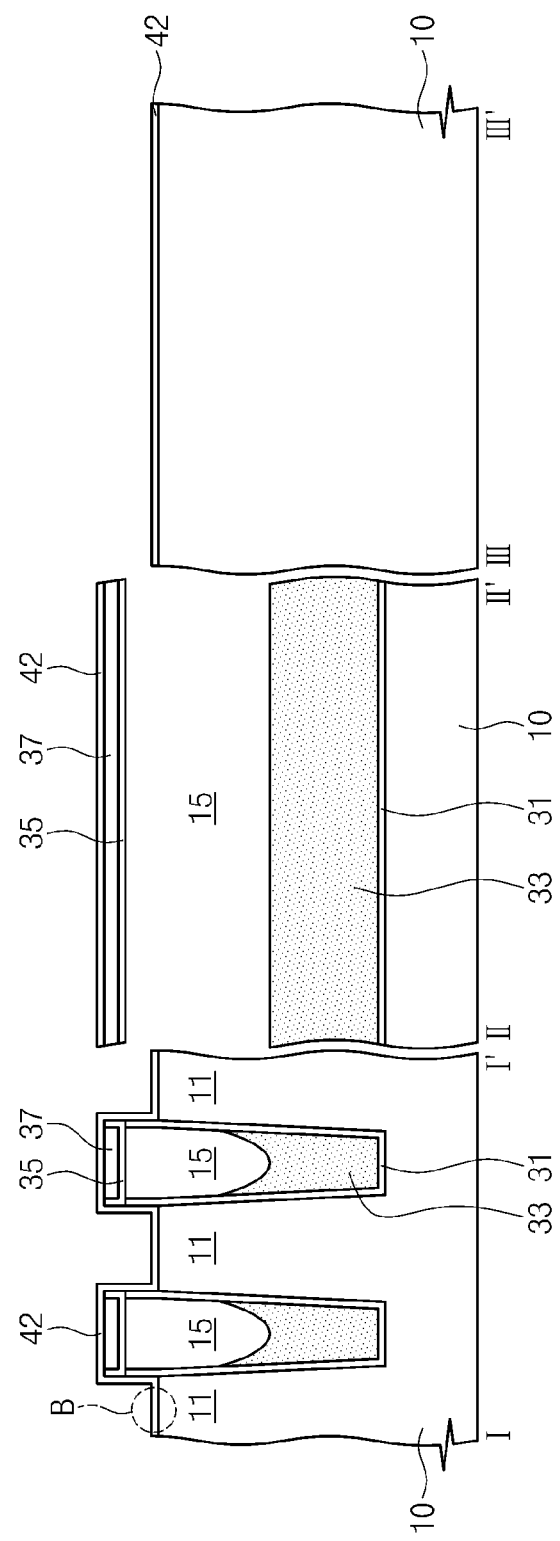
Figure 26:
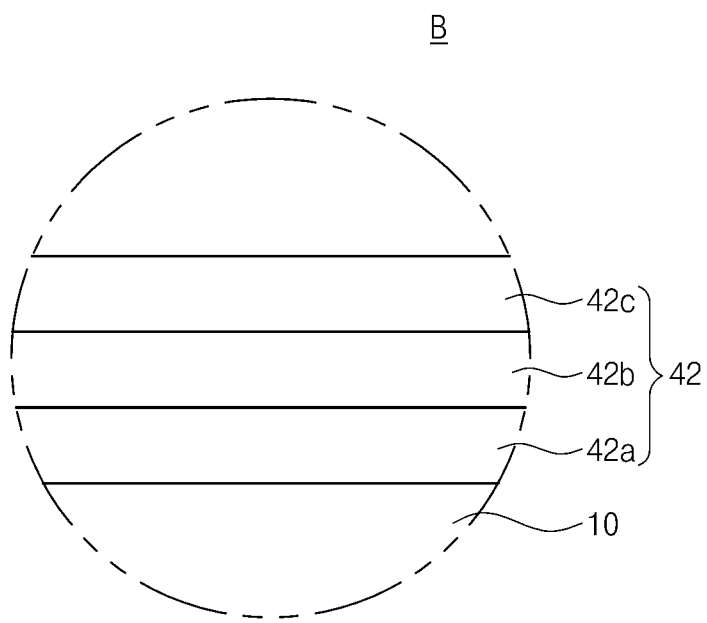
FIG. 26 is an enlarged view illustrating a portion 'B' of FIG. 25.

FIGS. 21 to 25 and FIGS. 27 to 29 are merged cross sectional views taken along lines I-I', II-II' and III-III' of FIG. 4, and FIG. 26 is an enlarged view illustrating a portion 'B' of FIG. 25. For the purpose of simplification in explanation, differences between the present example embodiments and the previous example embodiments will be mainly described in detail hereinafter.

Figure 21:
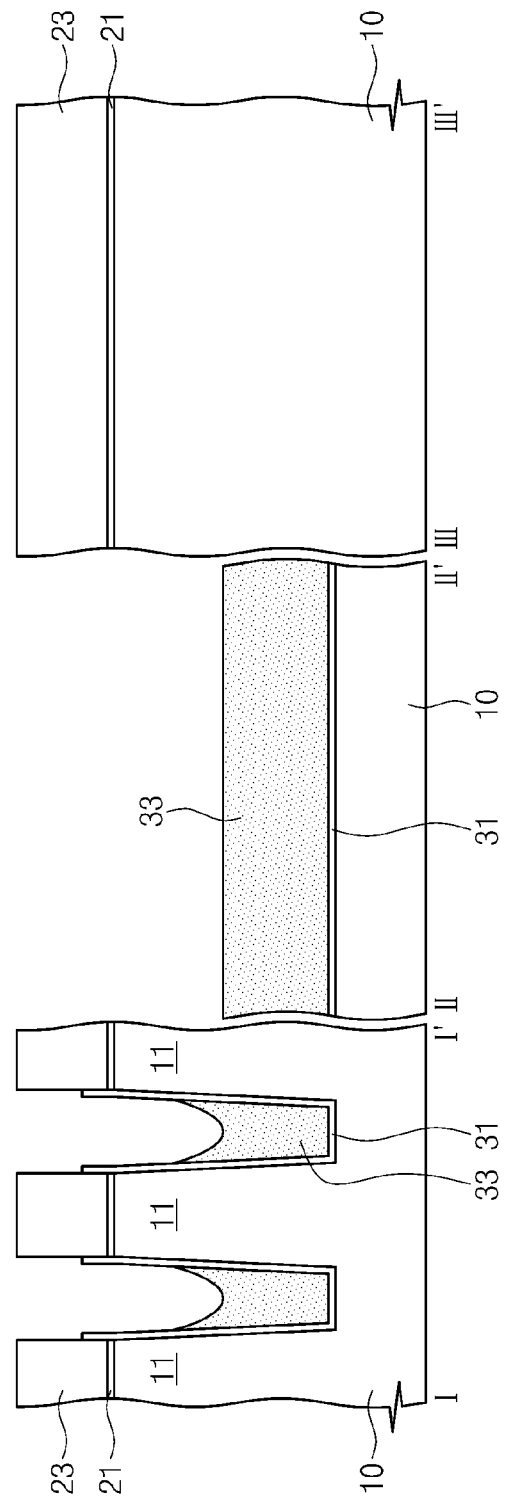
FIGS. 21 to 25 and FIGS. 27 to 29 are merged cross sectional views taken along lines I-I', II-II' and III-III' of FIG. 4 to illustrate a method of fabricating a semiconductor device according to example embodiments.

Referring to FIG. 21, an insulating isolation layer 33 may be formed on a substrate 10 using the same methods as described with reference to FIGS. 5 and 6. The insulating isolation layer 33 may be then recessed by removing an upper portion of the insulating isolation layer 33, as illustrated in FIG. 21. The recessed insulating isolation layer 33 may have a concave top surface. The insulating isolation layer 33 may be recessed using an etch-back process. A top surface of the recessed insulating isolation layer 33 may be located at a lower level than top surfaces of the active regions 11. An upper portion of the liner insulation layer 31 may be removed during the etch-back process for recessing the insulating isolation layer 33.

Figure 22:
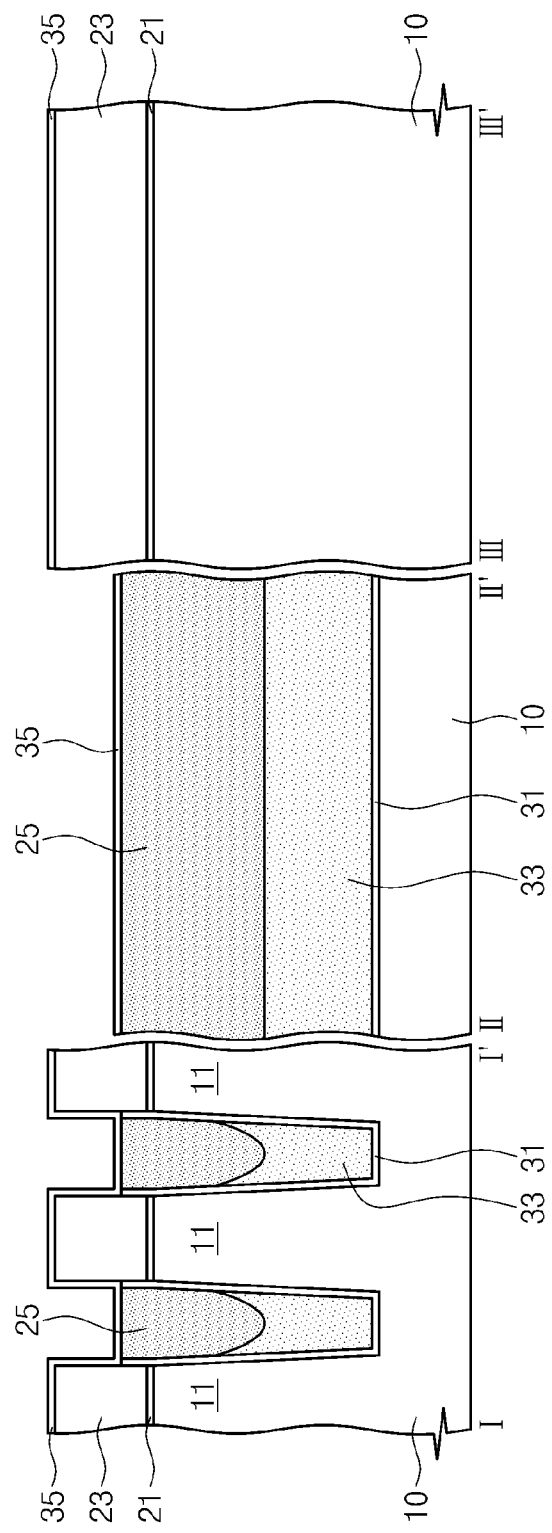

Referring to FIG. 22, a first sacrificial layer 25 may be formed on the recessed insulating isolation layer 33 to fill an upper portion of the trench 13. Preferably, the first sacrificial layer 25 may be formed of a material that is more readily removable as compared with the insulating isolation layer 33 and the liner insulation layer 31. That is, the first sacrificial layer 25 may have an etch selectivity with respect to the insulating isolation layer 33 and the liner insulation layer 31. The first sacrificial layer 25 may be formed using substantially the same method as described with reference to FIG. 2.

An upper portion of the first sacrificial layer 25 may be removed to recess the first sacrificial layer 25. A top surface of the recessed first sacrificial layer 25 may be located at a level between the top surfaces and the bottom surface of the mask patterns 23. The first sacrificial layer 25 may be recessed using an etch-back process.

A first porous insulation layer 35 may be formed to cover the mask patterns 23 and the recessed first sacrificial layer 25. The first porous insulation layer 35 may have a plurality of pores therein. The first porous insulation layer 35 may be formed using substantially the same method as described with reference to FIG. 2.

Referring to FIG. 23, the first sacrificial layer 25 may be selectively removed using a chemical gas or a wet etchant penetrating the first porous insulation layer 35 via the pores, as described with reference to FIG. 3. As a result of selective removal of the first sacrificial layer 25, a first air gap 15 extending in the first direction may be formed between the first porous insulation layer 35 and the insulating isolation layer 33. Thus, the first air gap 15 may expose a top surface of the insulating isolation layer 33. The first air gap 15 may be an empty space surrounded by a top surface of the insulating isolation layer 33, the liner insulation layer 31 and a bottom surface of the first porous insulation layer 35.

Referring to FIG. 24, a second sacrificial layer (not shown) may be formed on the first porous insulation layer 35. The second sacrificial layer may be formed to fill spaces between the mask patterns 23. The second sacrificial layer may be formed of a silicon oxide layer having an excellent gap filling property (e.g., a spin on glass (SOG) layer). The second sacrificial layer and the first porous insulation layer 35 may be recessed to expose top surfaces and/or sidewalls of the mask patterns 23. After the second sacrificial layer and the first porous insulation layer 35 are recessed, sacrificial patterns 37 may remain on the recessed first porous insulation layers 35, as illustrated in FIG. 24. Alternatively, while the second sacrificial layer and the first porous insulation layer 35 are recessed, the second sacrificial layer may be completely removed.

Referring to FIG. 25, the mask patterns 23 and the pad oxide layer 21 may be removed to expose the active regions 11. A charge storage layer 42 may be formed on the exposed active regions 11. The charge storage layer 42 may be formed to extend onto the first porous insulation layer 35 and the sacrificial patterns 37.

Referring to FIG. 26, the charge storage layer 42 may be formed to include a tunnel insulation layer 42a, a charge trap layer 42b and a blocking insulation layer 42c. The charge storage layer 42 may be formed using a CVD process or an ALD process. Each of the tunnel insulation layer 42a and the blocking insulation layer 42c may be formed to include at least one of a silicon oxide layer, a silicon nitride layer, an aluminum oxide ($Al_2O_3$) layer, a hafnium aluminate (HfAlO) layer, a hafnium aluminum silicon oxynitride (HfAlON) layer, a hafnium silicate (HfSiO) layer and a hafnium silicon oxynitride (HfSiON) layer. The blocking insulation layer 42c may be formed to include a material having a higher dielectric constant than the tunnel insulation layer 42a. The blocking insulation layer 42c may be thicker than the tunnel insulation layer 42a. The charge trap layer 42b may be a charge storage layer in which charges are stored. The charge trap layer 42b may include at least one of a polysilicon layer, a silicon nitride (SiN) layer, a nano crystalline silicon layer, a nano crystalline silicon-germanium layer, a nano crystalline metal layer, an aluminum oxide ($Al_2O_3$) layer, a hafnium oxide ($HfO_2$) layer, a hafnium aluminate (HfAlO) layer and a hafnium silicon oxynitride (HfSiON) layer.

Figure 27:
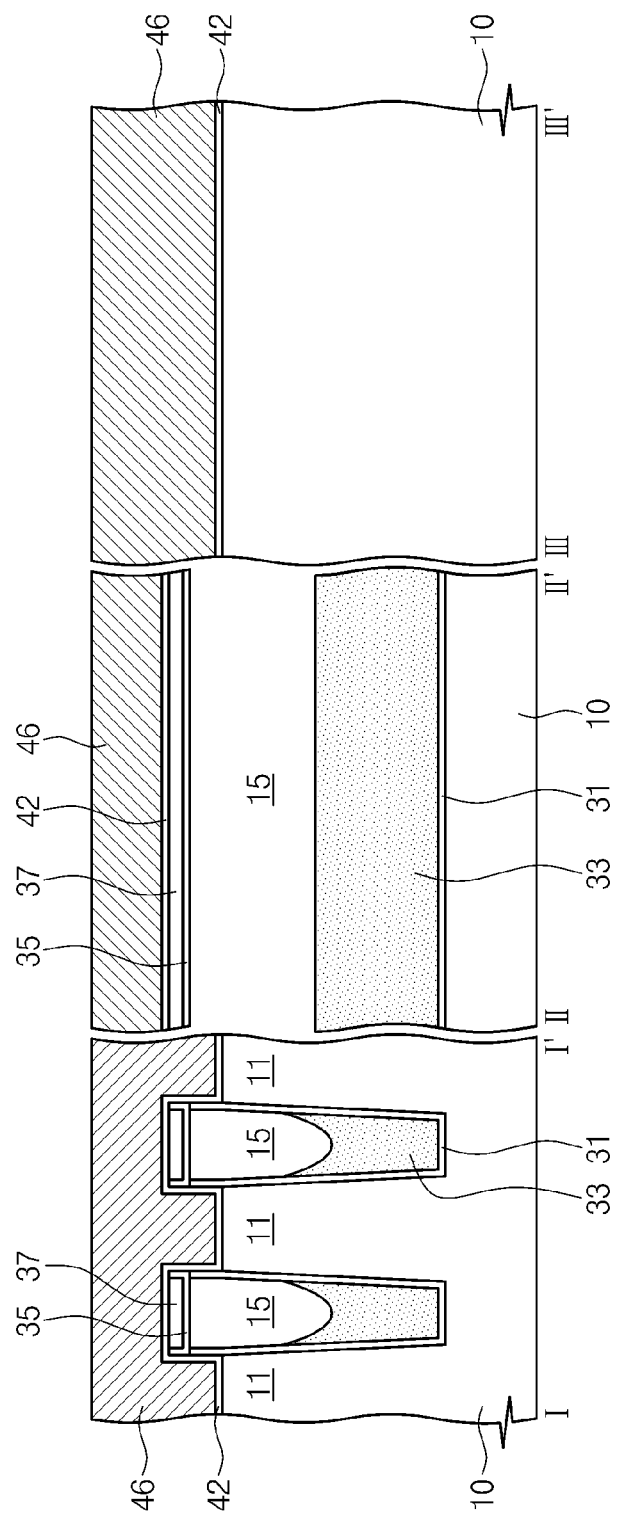

Referring to FIG. 27, a gate conductive layer 46 may be formed on the charge storage layer 42. The gate conductive layer 46 may include a material having a work function which is greater than 4 electron volts (eV). For example, the gate conductive layer 46 may include at least one of a P-type semiconductor layer, a tantalum nitride (TaN) layer, a tantalum (Ta) layer, a ruthenium (Ru) layer, a tungsten nitride (WN) layer, a tungsten (W) layer, a titanium (Ti) layer, a titanium nitride (TiN) layer, a tantalum-titanium (TaTi) layer, a tantalum-platinum (TaPt) layer, a tantalum silicon nitride (TaSiN) layer, a hafnium nitride (HfN) layer, a titanium aluminum nitride (TiAlN) layer, a molybdenum (Mo) layer and a platinum (Pt) layer.

Figure 28:
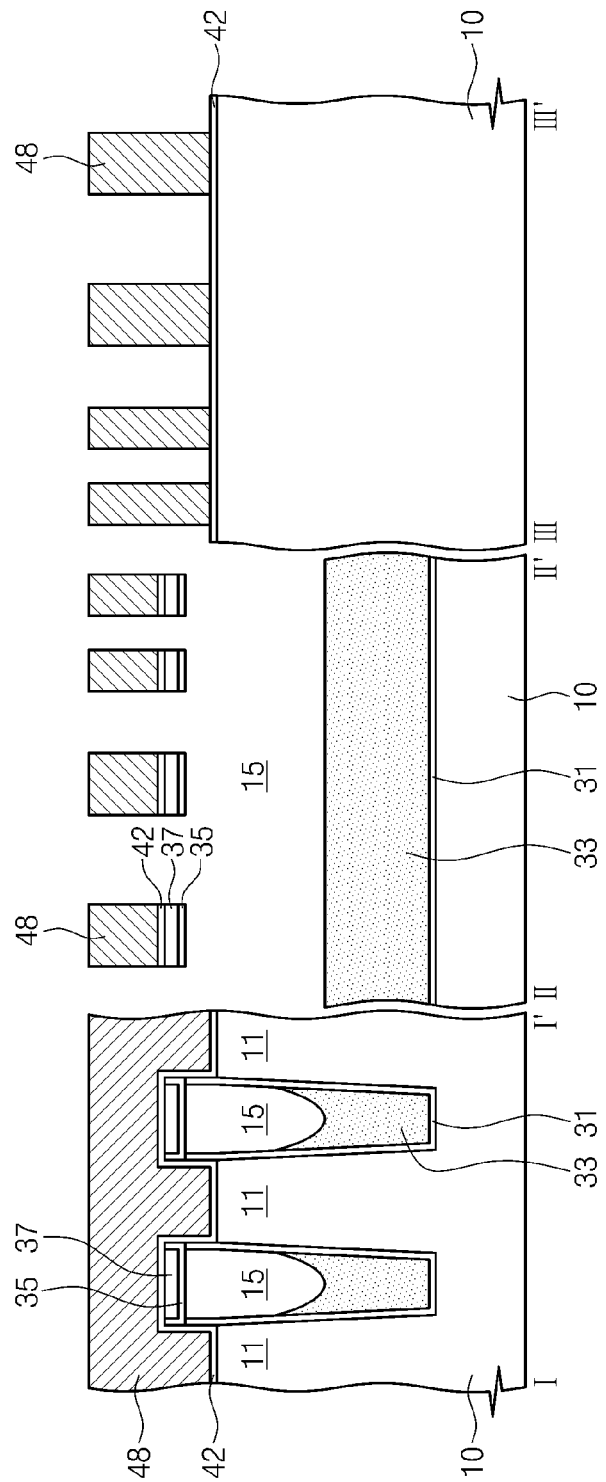

Referring to FIG. 28, the gate conductive layer 46 may be patterned to form gate electrodes 48 extending in the second direction. The gate electrodes 48 may cross over the active regions 11. The gate electrodes 48 may include word lines WL0-WLn−1, string selection lines SSL and ground selection lines GSL.

Figure 29:
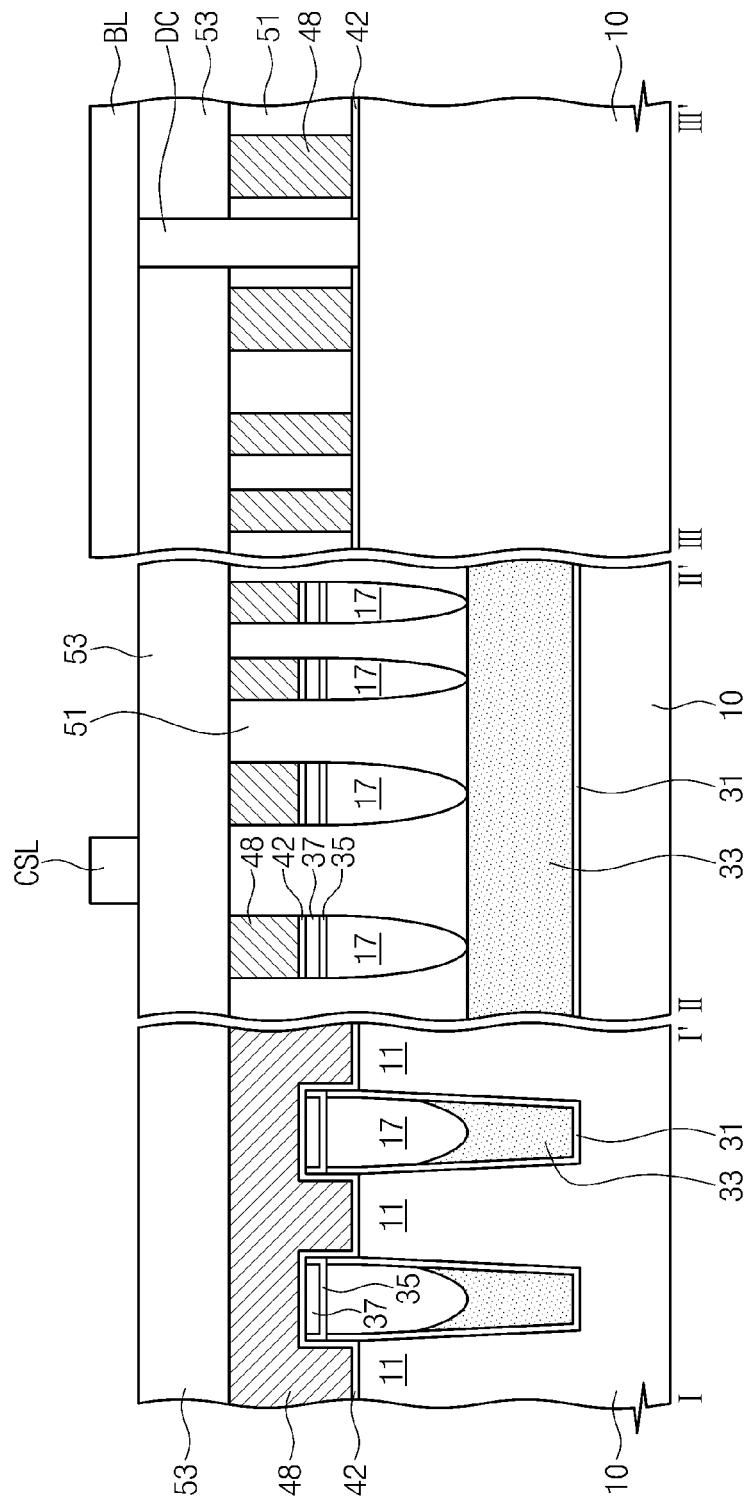

Referring to FIG. 29, a buried insulation layer 51 may be formed on an entire surface of the substrate including the gate electrodes 48. The buried insulation layer 51 may be formed using an insulation layer having a poor step coverage characteristic and/or using a deposition process exhibiting a poor step coverage characteristic. The buried insulation layer 51 may be formed of a silicon oxide layer. The buried insulation layer 51 may fill empty spaces between the gate electrodes 48 but may hardly fill portions of the first air gap 15 directly below the first porous insulation layers 35. Only a portion of the first air gap 15 below each of the first porous insulation layers 35 may be filled with the buried insulation layer 51. Thus, second air gaps 17 may be formed below respective ones of the recessed first porous insulation layers 35, and a lower width of the second air gaps 17 may be less than an upper width thereof. Each of the second air gaps 17 may be surrounded by a top surface of the insulating isolation layer 33, the liner insulation layer 31, the buried insulation layer 51 and a bottom surface of the first porous insulation layer 35. However, the second air gaps 17 may not limited to the aforementioned configuration. For example, the buried insulation layer 51 may be formed to cover the entire top surface of the insulating isolation layer 33. In this case, the second air gaps 17 may be spaced apart from the insulating isolation layer 33 by the buried insulation layer 51.

A first interlayer insulation layer 53 may be formed on the buried insulation layer 51 and the gate electrodes 48. The first interlayer insulation layer 53 may be formed of a silicon oxide layer. Bit lines BL and a common source line CSL may be formed on the first interlayer insulation layer 53. The bit lines BL may be connected to drain regions between the neighboring string selection lines SSL through bit line contacts DC penetrating the first interlayer insulation layer 53 and the buried insulation layer 51. The common source line CSL may be connected to source regions between the neighboring ground selection lines GSL through contacts having a similar configuration to the bit line contacts DC (refer to FIG. 4).

A semiconductor device according to yet example embodiments will now be described with reference to FIGS. 29 and 30.

Figure 30:
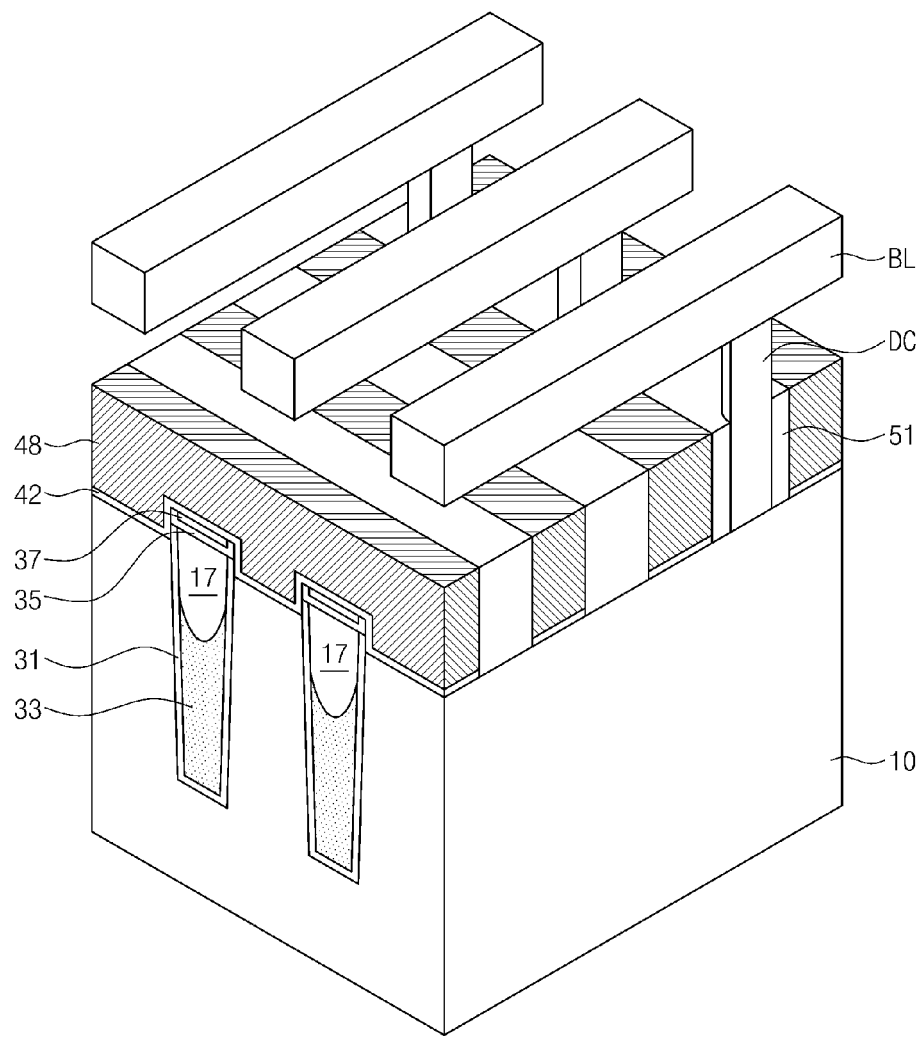
FIG. 30 is a perspective view relating to FIG. 29.

FIG. 30 is a perspective view relating to FIG. 29. For the purpose of simplification in explanation, differences between the present example embodiments and the previous example embodiments illustrated in FIGS. 14 and 15 will be mainly described in detail hereinafter.

Referring to FIGS. 29 and 30, an insulating isolation layer 33 may be provided in a lower portion of a trench 13 formed in a substrate 10. A liner insulation layer 31 may be disposed between the insulating isolation layer 33 and inner surface of the trench 13. First porous insulation layers 35 may be provided over the insulating isolation layer 33 to be spaced apart from the insulating isolation layer 33.

Charge storage layers 42 may be provided on the active regions 11. The charge storage layers 42 may extend onto the first porous insulation layers 35. Each of the charge storage layers 42 may include a tunnel insulation layer 42a, a charge trap layer 42b and a blocking insulation layer 42c (refer to FIG. 26). Each of the tunnel insulation layer 42a and the blocking insulation layer 42c may include at least one of a silicon oxide layer, a silicon nitride layer, an aluminum oxide ($Al_2O_3$) layer, a hafnium aluminate (HfAlO) layer, a hafnium aluminum silicon oxynitride (HfAlON) layer, a hafnium silicate (HfSiO) layer and a hafnium silicon oxynitride (HfSiON) layer. The blocking insulation layer 42c may include a material having a higher dielectric constant than the tunnel insulation layer 42a. The blocking insulation layer 42c may be thicker than the tunnel insulation layer 42a. The charge trap layer 42b may include at least one of a polysilicon layer, a silicon nitride (SiN) layer, a nano crystalline silicon layer, a nano crystalline silicon-germanium layer, a nano crystalline metal layer, an aluminum oxide ($Al_2O_3$) layer, a hafnium oxide ($HfO_2$) layer, a hafnium aluminate (HfAlO) layer and a hafnium silicon oxynitride (HfSiON) layer.

Gate electrodes 48 may be provided on respective ones of the charge storage layers 42. Each of the gate electrodes 48 may include a material having a work function which is greater than 4 electron volts (eV). For example, each of the gate electrodes 48 may include at least one of a P-type semiconductor layer, a tantalum nitride (TaN) layer, a tantalum (Ta) layer, a ruthenium (Ru) layer, a tungsten nitride (WN) layer, a tungsten (W) layer, a titanium (Ti) layer, a titanium nitride (TiN) layer, a tantalum-titanium (TaTi) layer, a tantalum-platinum (TaPt) layer, a tantalum silicon nitride (TaSiN) layer, a hafnium nitride (HfN) layer, a titanium aluminum nitride (TiAlN) layer, a molybdenum (Mo) layer and a platinum (Pt) layer.

Sacrificial patterns 37 may be disposed between the first porous insulation layers 35 and the charge storage layers 42. Each of the sacrificial patterns 37 may include a material having an excellent gap filling property. For example, each of the sacrificial patterns 37 may be a spin on glass (SOG) layer.

A buried insulation layer 51 may fill spaces between the gate electrodes 48. The buried insulation layer 51 may be formed using an insulation layer having a poor step coverage characteristic and/or using a deposition process exhibiting a poor step coverage characteristic. The buried insulation layer 51 may be a silicon oxide layer. Second air gaps 17, for example, empty spaces, may be provided below respective ones of the first porous insulation layers 35. Each of the second air gaps 17 may be surrounded by a top surface of the insulating isolation layer 33, the liner insulation layer 31, the buried insulation layer 51 and a bottom surface of the first porous insulation layer 35. However, the second air gaps 17 may not be limited to the aforementioned configuration. For example, the buried insulation layer 51 may cover the entire top surface of the insulating isolation layer 33. In this case, the second air gaps 17 may be spaced apart from the insulating isolation layer 33 by the buried insulation layer 51. A lower width of the second air gaps 17 may be less than an upper width thereof.

A first interlayer insulation layer 53 may be disposed on the buried insulation layer 51 and the gate electrodes 48. The first interlayer insulation layer 53 may be a silicon oxide layer. Bit lines BL and a common source line CSL may be provided on the first interlayer insulation layer 53. The bit lines BL may be connected to drain regions between the neighboring string selection lines SSL through bit line contacts DC penetrating the first interlayer insulation layer 53 and the buried insulation layer 51. The common source line CSL may be connected to source regions between the neighboring ground selection lines GSL through contacts having a similar configuration to the bit line contacts DC (refer to FIG. 4).

According to example embodiments, because the second air gaps 17 between the active regions 11 are filled with air, a dielectric constant of the second air gaps 17 may be lower than that of a silicon oxide layer. Thus, the second air gaps 17 may significantly reduce the parasitic capacitance between memory cells (e.g., active regions 11) adjacent to each other. That is, the second air gaps 17 can minimize an interference effect between the adjacent memory cells.

Now, a method of fabrication a semiconductor device according to example embodiments will be described.

FIGS. 31 to 34 are merged cross sectional views taken along lines I-I', II-II' and III-III' of FIG. 4 to illustrate a method of fabricating a semiconductor device according to example embodiments.

Figure 31:
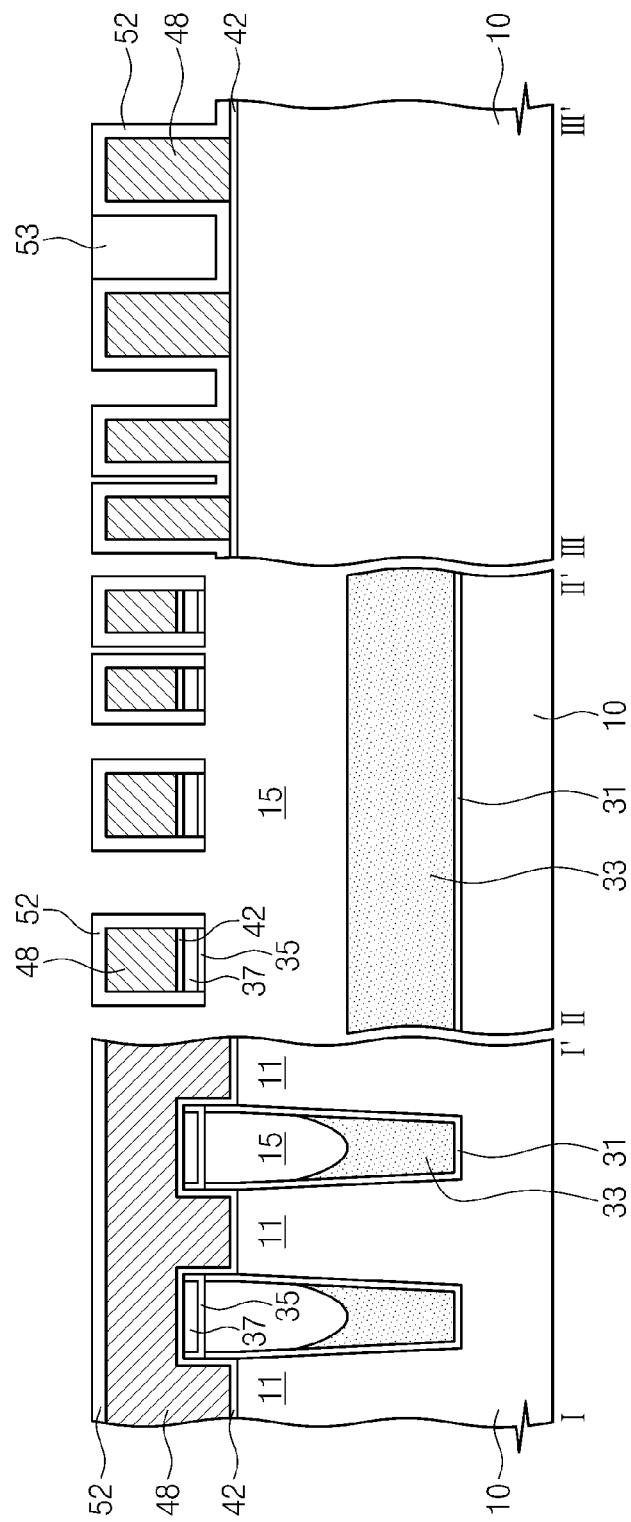
FIGS. 31 to 34 are merged cross sectional views taken along lines I-I', II-II' and III-III' of FIG. 4 to illustrate a method of fabricating a semiconductor device according to example embodiments.

Referring to FIG. 31, a spacer layer 52 may be formed on the substrate having the gate electrodes 48, which is described with reference to FIGS. 21 to 28. The spacer layer 52 may be conformally formed not to fill spaces between the gate electrodes 48. The spacer layer 52 may be formed of a silicon oxide layer, a silicon nitride layer or a silicon oxynitride layer. Although not shown in the drawings, a portion the spacer layer 52 may be formed on the insulating isolation layer 33.

First mask layers 53 may be formed on the spacer layer 52 between the pair of neighboring string selection lines SSL and on the spacer layer 52 between the pair of neighboring ground selection lines GSL. The first mask layers 53 may be formed of photoresist. For example, the first mask layers 53 may be formed by coating a photoresist layer on the substrate and patterning the photoresist layer using an exposure process to leave some portions of the photoresist layer only in spaces between the neighboring string selection lines SSL and between the neighboring ground selection lines GSL.

Figure 32:
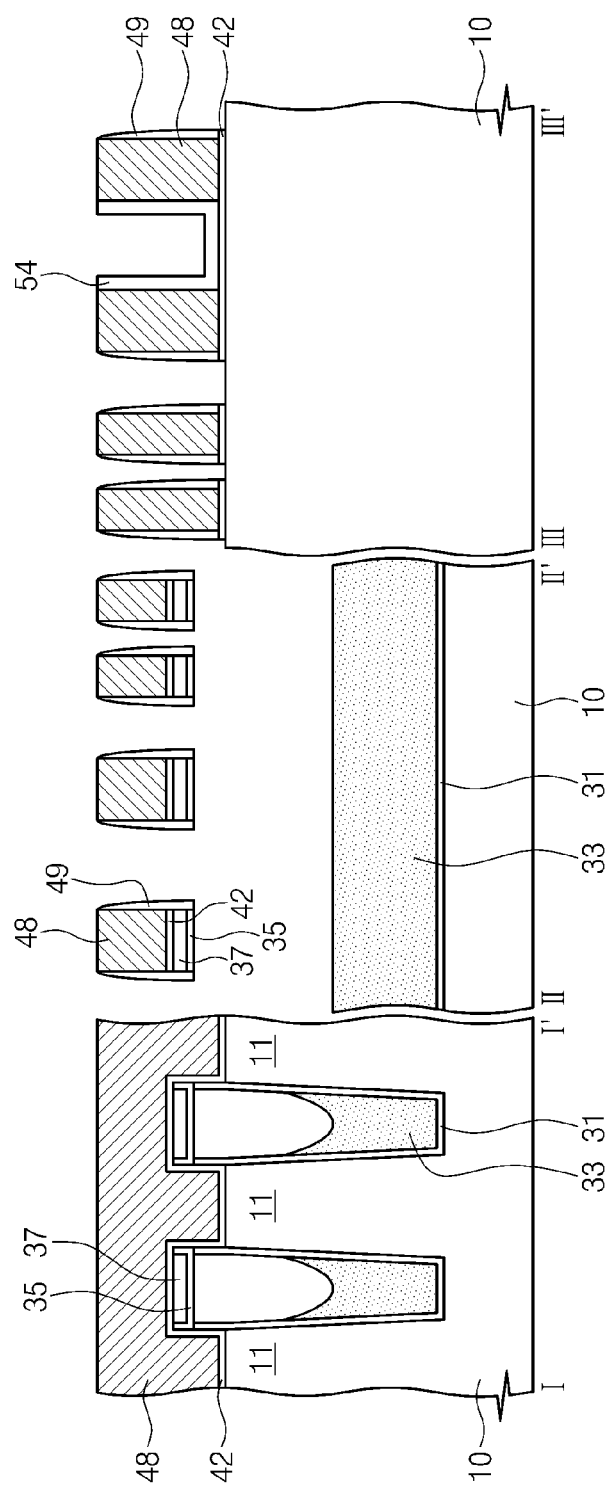

Referring to FIG. 32, sidewall spacers 49 may be formed on sidewalls of the gate electrodes 48. The sidewall spacers 49 may be formed by anisotropically etching the spacer layer 52 using the first mask layers 53 as etch masks. During the anisotropic etching process (e.g., an etch-back process), the spacer layer 52 between the neighboring string selection lines SSL and between the neighboring ground selection lines GSL may be covered with the first mask layers 53. Thus, as a result of the etch-back process, insulation spacer layers 54 having a 'U'-shaped cross section may be formed between the neighboring string selection lines SSL and between the neighboring ground selection lines GSL. The first mask layers 53 may be then removed.

Figure 33:
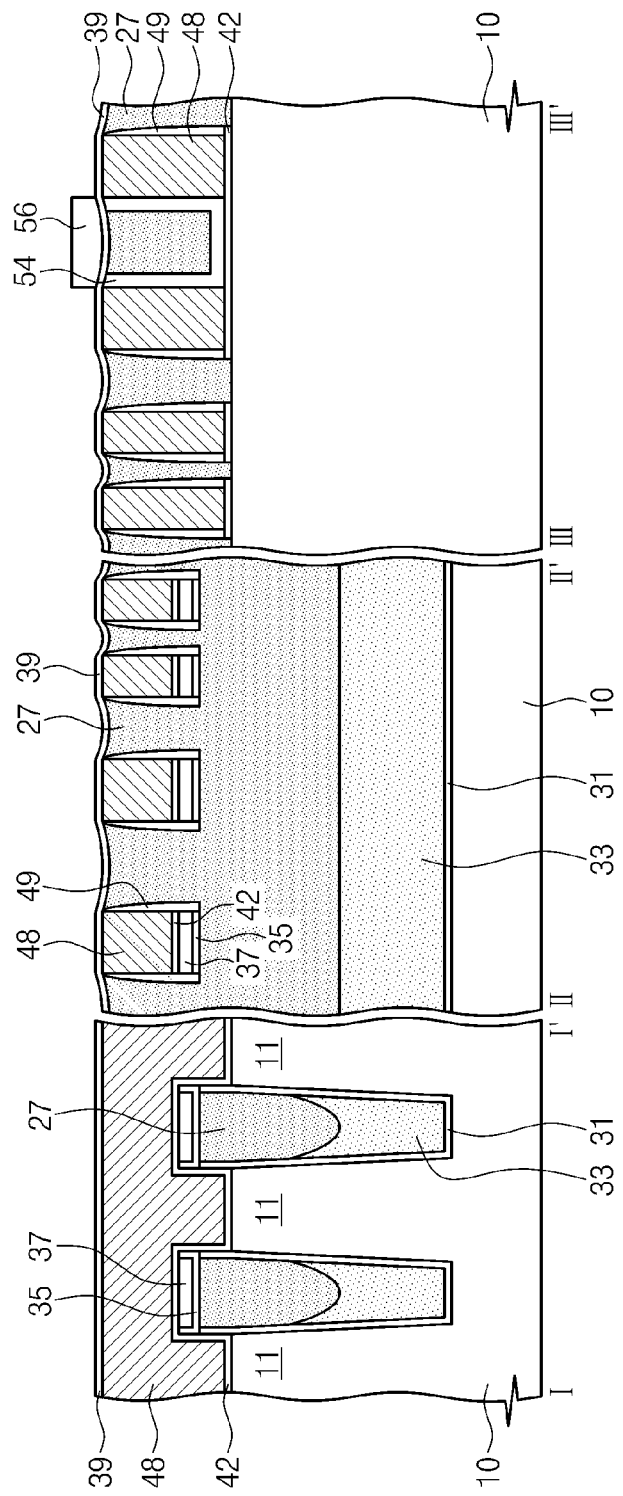

Referring to FIG. 33, a third sacrificial layer 27 may be formed to fill the first air gap 15 and spaces between the gate electrodes 48. The third sacrificial layer 27 may be formed of a material that is more readily removable as compared with the liner insulation layer 31 and the insulating isolation layer 33. That is, the third sacrificial layer 27 may have an etch selectivity with respect to the liner insulation layer 31, the insulating isolation layer 33 and the sidewall spacers 49. The third sacrificial layers 27 may be formed using substantially the same method as described with reference to FIG. 2. The third sacrificial layer 27 may be planarized to expose top surfaces of the gate electrodes 48. The planarization process may be performed using a chemical mechanical polishing (CMP) process. During the planarization process, the third sacrificial layer 27 between the gate electrodes 48 may be recessed. Thus, after the planarization process is performed, the third sacrificial layer 27 remaining between the gate electrodes 48 may be formed to have a top surface which is located at a lower level than a top surface of the gate electrodes 48.

A second porous insulation layer 39 having a plurality of pores may be formed on the gate electrodes 48 and the third sacrificial layer 27. The second porous insulation layer 39 may be formed using substantially the same method as described with reference to FIG. 2.

Second mask layers 56 may be formed on the second porous insulation layer 39. The second mask layers 56 may be formed over respective ones of the insulation spacer layers 54 which are disposed between the neighboring string selection lines SSL and between the neighboring ground selection lines GSL. The second mask layers 56 may block paths that penetrate the second porous insulation layer 39 via the pores. The second mask layers 56 may be formed of a silicon oxide layer.

Figure 34:
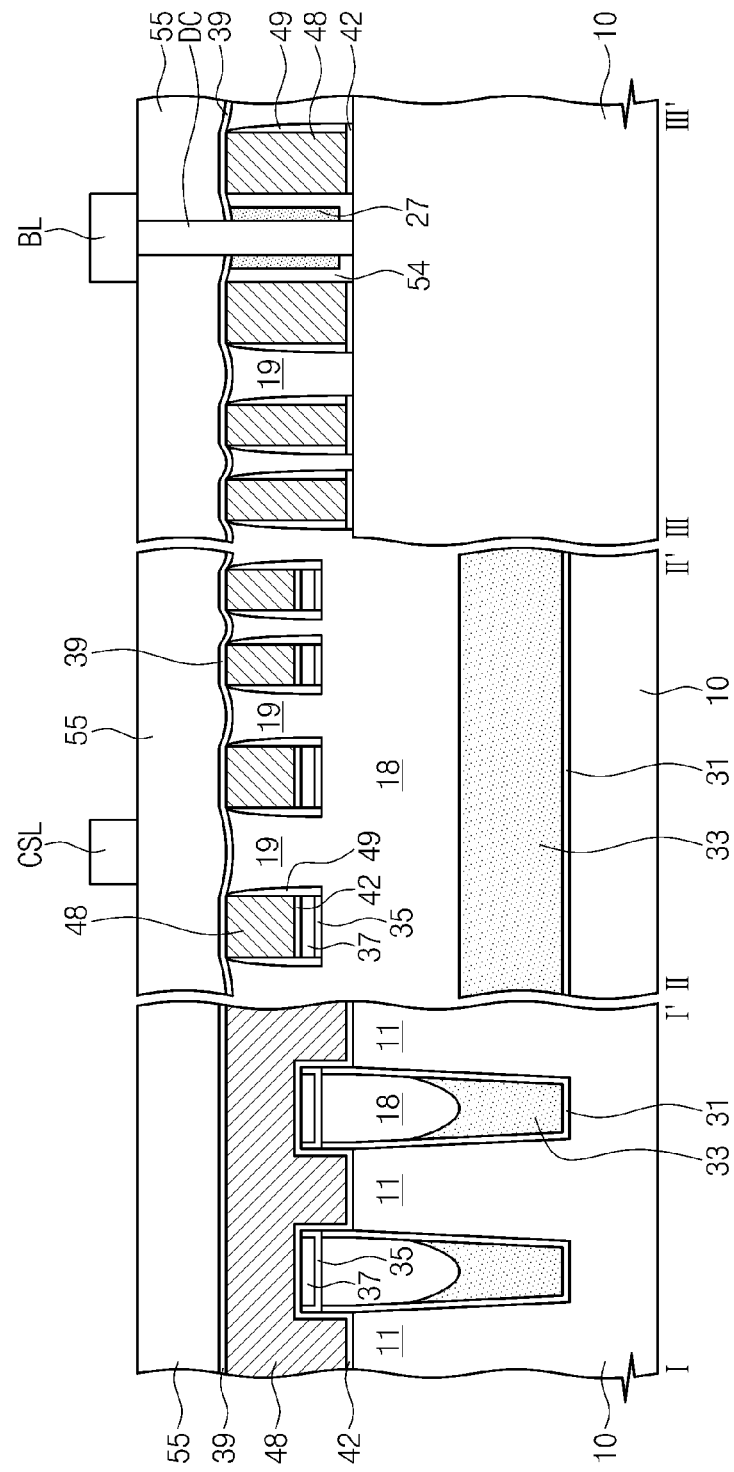

Referring to FIG. 34, the third sacrificial layer 27 may be selectively removed using a chemical gas or a wet etchant penetrating the second porous insulation layer 39 via the pores. Because of the presence of the second mask layers 56, the third sacrificial layers 27 between the neighboring string selection lines SSL and between the neighboring ground selection lines GSL may remain even after selective removal of the third sacrificial layer 27. The third sacrificial layer 27 may be selectively removed using substantially the same method as described with reference to FIG. 3. As a result of selective removal of the third sacrificial layer 27, third air gaps 18 and fourth air gaps 18 and 19 may be formed.

Each of the third air gaps 18 may be an empty space that is surrounded by a top surface of the insulating isolation layer 33, the liner insulation layer 31 and a bottom surface of the first porous insulation layer 35 to extend in the first direction. Each of the fourth air gaps 19 may be an empty space that is disposed between the pair of adjacent gate electrodes 48 to extend in the second direction intersecting the first direction. The fourth air gaps 19 may be located below the second porous insulation layer 39. The fourth air gaps 19 may be spatially connected to the third air gaps 18.

A second interlayer insulation layer 55 may be formed on the second porous insulation layer 39. The second interlayer insulation layer 55 may be a silicon oxide layer. Bit lines BL and a common source line CSL may be formed on the second interlayer insulation layer 55. The bit lines BL may be connected to drain regions between the neighboring string selection lines SSL through bit line contacts DC penetrating the second interlayer insulation layer 55, the second porous insulation layer 39, the third sacrificial layer 27 and the insulation spacer layers 54. The common source line CSL may be connected to source regions between the neighboring ground selection lines GSL through contacts having a similar configuration to the bit line contacts DC (refer to FIG. 4).

A semiconductor device according to example embodiments will now be described with reference to FIGS. 34 and 35.

Figure 35:
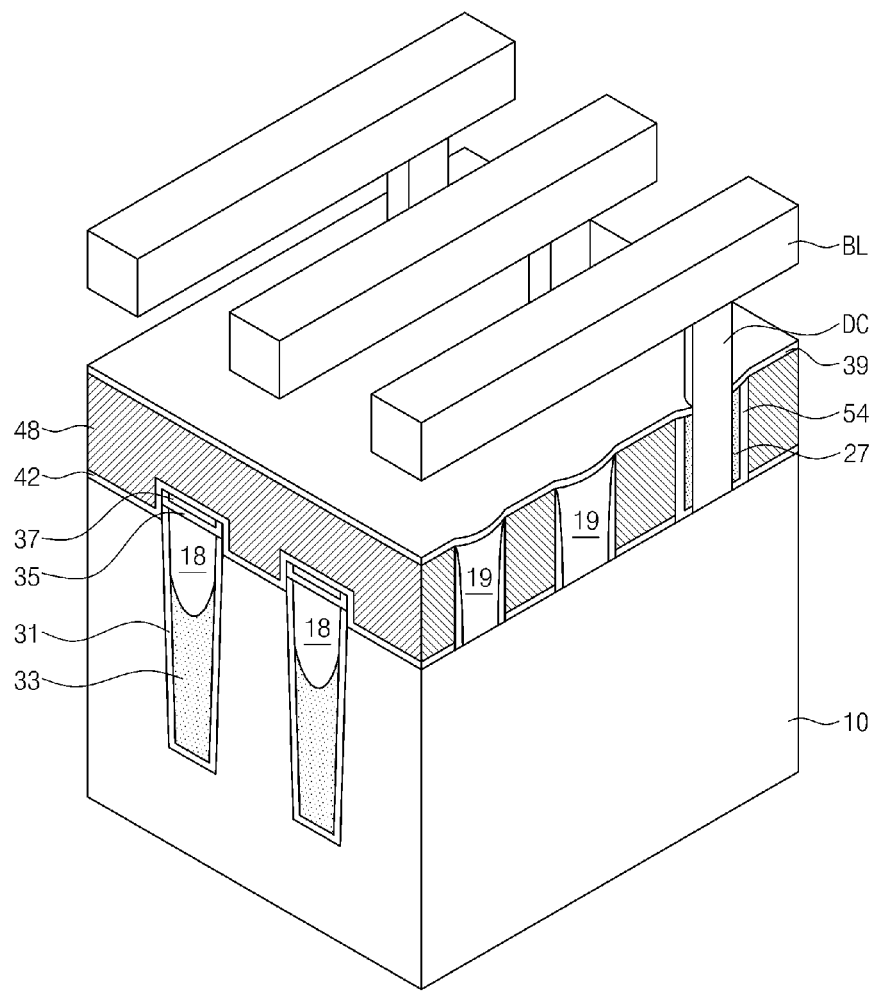
FIG. 35 is a perspective view relating to FIG. 34.

FIG. 35 is a perspective view relating to FIG. 34. For the purpose of simplification in explanation, differences between the present example embodiments and the previous example embodiments illustrated in FIGS. 29 and 30 will be mainly described in detail hereinafter.

Referring to FIGS. 34 and 35, sidewall spacers 49 may be provided on sidewalls of the gate electrodes 48. Insulation spacer layers 54 having a 'U'-shaped cross section may be provided between the neighboring string selection lines SSL and between the neighboring ground selection lines GSL. The sidewall spacers 49 and the insulation spacer layers 54 may be the same material. For example, the sidewall spacers 49 and the insulation spacer layers 54 may be a silicon oxide layer, a silicon nitride layer or a silicon oxynitride layer. Third sacrificial layers 27 may be disposed on respective ones of the insulation spacer layers 54 between the neighboring string selection lines SSL and between the neighboring ground selection lines GSL. The third sacrificial layers 27 may be a silicon oxide layer having an etch selectivity with respect to the insulation spacer layers 54.

A second porous insulation layer 39 may be disposed on the gate electrodes 48. The second porous insulation layer 39 may extend to cover spaces between the gate electrodes 48. At least a bottom surface of the second porous insulation layer 39 between the gate electrodes 48 may be located at a lower level than top surfaces of the gate electrodes 48.

Third air gaps 18 may be provided between the insulating isolation layer 33 and the first porous insulation layers 35. Each of the third air gaps 18 may be an empty space that is surrounded by a top surface of the insulating isolation layer 33, the liner insulation layer 31 and a bottom surface of the first porous insulation layer 35 to extend in the first direction. Fourth air gaps 19 may be provided between the gate electrodes 48 to extend in the second direction intersecting the first direction. The fourth air gaps 19 may be located below the second porous insulation layer 39. The fourth air gaps 19 may be spatially connected to the third air gaps 18.

A second interlayer insulation layer 55 may be provided on the second porous insulation layer 39. The second interlayer insulation layer 55 may be a silicon oxide layer. Bit lines BL and a common source line CSL may be provided on the second interlayer insulation layer 55. The bit lines BL may be connected to drain regions between the neighboring string selection lines SSL through bit line contacts DC penetrating the second interlayer insulation layer 55, the second porous insulation layer 39, the third sacrificial layer 27 and the insulation spacer layers 54. The common source line CSL may be connected to source regions between the neighboring ground selection lines GSL through contacts having a similar configuration to the bit line contacts DC (refer to FIG. 4).

According to example embodiments, because the third air gaps 18 and the fourth air gaps 19 are filled with air, dielectric constants of the third and fourth air gaps 18 and 19 may be lower than a dielectric constant of a silicon oxide layer. Thus, the third air gaps 18 may significantly reduce the parasitic capacitance between memory cells (e.g., active regions 11) adjacent to each other. That is, the third air gaps 18 can minimize an interference effect between the adjacent memory cells. Further, the fourth air gaps 19 may significantly reduce the parasitic capacitance between the adjacent gate electrodes 48. Thus, the fourth air gaps 19 can also minimize an interference effect between the adjacent memory cells.

Now, a method of fabrication a semiconductor device according to example embodiments will be described.

Figure 36:
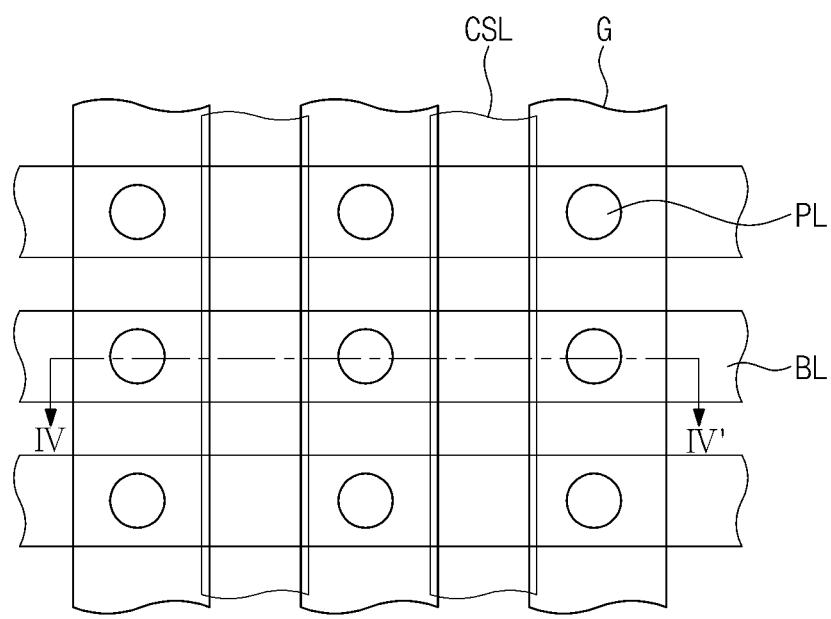
FIG. 36 illustrates another example of layout diagrams of semiconductor devices according to example embodiments.

FIG. 36 illustrates another example of layout diagrams of semiconductor devices according to some example embodiments.

The semiconductor devices according to example embodiments may include three dimensional vertical NAND-type nonvolatile memory cells, as illustrated in FIG. 36.

Referring to FIG. 36, gate electrode stacks G may extend in a first direction to be parallel with each other. Common source lines CSL may be disposed in a substrate below spaces between the gate electrode stacks G. Bit lines BL may extend in a second direction intersecting the first direction to run across the gate electrode stacks G. Active pillars PL may be located at respective ones of intersections that the gate electrode stacks G and the bit lines BL cross each other. The active pillars PL may extend in a direction perpendicular to the substrate. That is, the active pillars PL may extend in a direction perpendicular to the first and second directions.

FIGS. 37 to 44 are drawings illustrating a method of fabricating a semiconductor device according to example embodiments. FIGS. 37 to 44 are cross sectional views taken along a line IV-IV' of FIG. 36.

Figure 37:
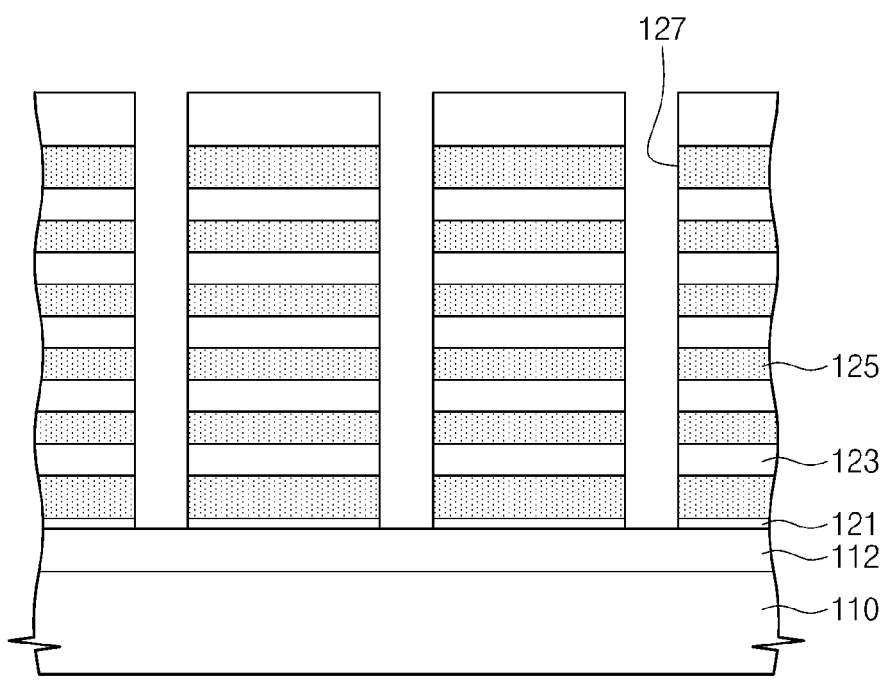
FIGS. 37 to 44 are cross sectional views taken along a line IV-IV' of FIG. 36 to illustrate a method of fabricating a semiconductor device according to example embodiments.

Referring to FIG. 37, a substrate 110 may be provided. Impurity ions of a first conductivity type may be injected into the substrate 110 to form a well region 112. The well region 112 may be formed using an ion implantation process.

A buffer dielectric layer 121 may be formed on the substrate having the well region 112. The buffer dielectric layer 121 may be, for example, a silicon oxide layer. The buffer dielectric layer 121 may be formed using a thermal oxidation process. First material layers 123 and second material layers 125 may be alternately stacked on the buffer dielectric layer 121. One of the second material layers 125 may be formed directly on the buffer dielectric layer 121 opposite to the substrate 110. That is, a lowermost material layer of the stacked material layers may be one of the second material layers 125. In addition, an uppermost material layer of the stacked material layers may be one of the first material layers 123. The uppermost second material layer 125 and the lowermost second material layer 125 may be formed to be thicker than the intermediate second material layers 125 therebetween. Each of the first material layers 123 may be an insulation layer. For example, each of the first material layers 123 may be formed to include a silicon oxide layer. Each of the second material layers 125 may be formed to include a material having a different wet etch rate from the first material layers 123. For example, the second material layers 125 may be formed to include a silicon nitride layer or a silicon oxynitride layer. The first and second material layers 123 and 125 may be formed using a chemical vapor deposition (CVD) process.

The buffer dielectric layer 121, the first material layers 123 and the second material layers 125 may be patterned to form channel holes 127 that penetrate the buffer dielectric layer 121, the first material layers 123 and the second material layers 125 to expose the substrate 110. The channel holes 127 may be arrayed along a first direction and a second direction. That is, the channel holes 127 may be disposed in a matrix form, when viewed from a plan view. The first direction and the second direction may be parallel with a top surface of the substrate 110 and may cross each other.

Figure 38:
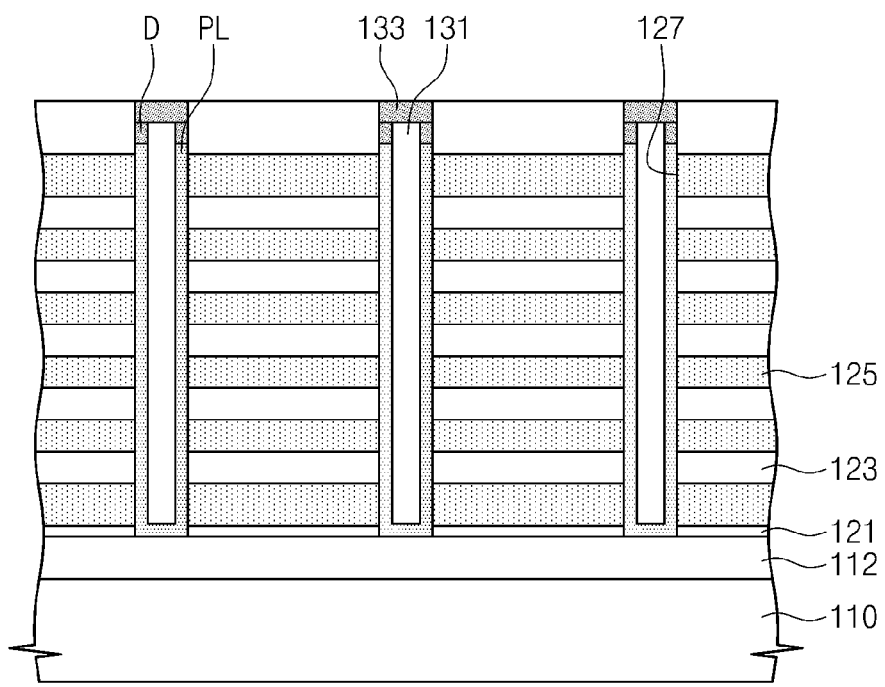

Referring to FIG. 38, active pillars PL may be formed in respective ones of the channel holes 127. The active pillars PL may be connected to the substrate 110. An example of methods of forming the active pillars PL will now be described in detail hereinafter. First, a channel semiconductor layer of the first conductivity type may be formed in the channel holes 127. In example embodiments, the channel semiconductor layer may be conformally formed not to fill the channel holes 127. An insulation layer may be then formed on the channel semiconductor layer to fill the channel holes 127. The insulation layer and the channel semiconductor layer may be planarized to expose the uppermost first material layer 123. As a result, a cylinder-shaped active pillar PL and a filling insulation layer 131 surrounded by the cylinder-shaped active pillar PL may be formed in each of the channel holes 127. Alternatively, the channel semiconductor layer may be formed to completely fill the channel holes 127. In this case, the process for forming the insulation layer may be omitted.

Upper portions of the active pillars PL may be removed to recess the active pillars PL. Thus, top surfaces of the active pillars PL may be located at a lower level than a top surface of the uppermost first material layer 123. Capping semiconductor patterns 133 may be formed to fill respective ones of the channel holes 127 on the recessed active pillars PL. Impurity ions of a second conductivity type may be implanted into upper portions of the active pillars PL to form drain regions D. While the drain regions D are formed, the impurity ions of the second conductivity type may also be implanted and/or diffused in the capping semiconductor patterns 133. Thus, the drain regions D may be formed to extend into the capping semiconductor patterns 133.

Figure 39:
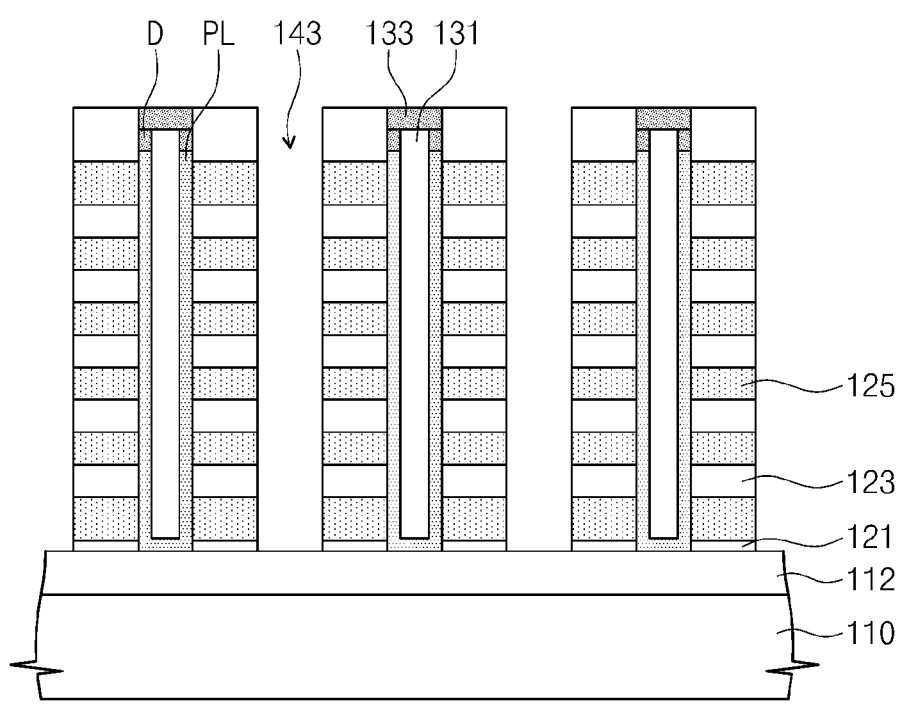
Figure 40:
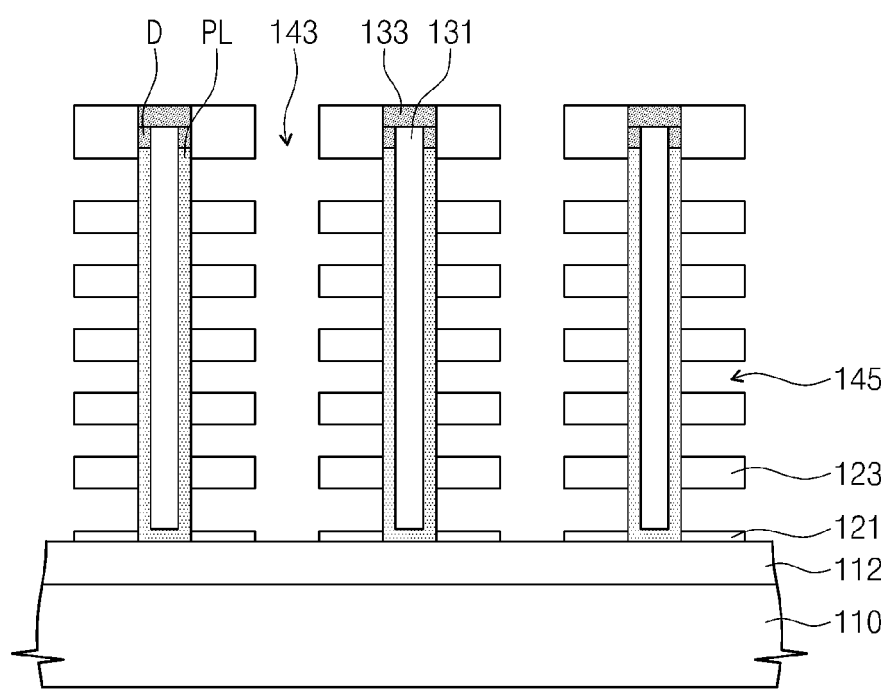

Referring to FIGS. 39 and 40, the first and second material layers 123 and 125 may be patterned to form grooves 143 spaced apart from each other. Each of the grooves 143 may be formed between the active pillars PL to extend in the first direction.

The second material layers 125 exposed by the grooves 143 may be selectively removed to form empty spaces 145. The empty spaces 145 may correspond to regions that the second material layers 125 are removed. When each of the second material layers 125 is formed of a silicon nitride layer, the second material layers 125 may be removed using an etchant including phosphoric acid ($H_3PO_4$). The empty spaces 145 may expose portions of sidewalls of the active pillars PL.

Figure 41:
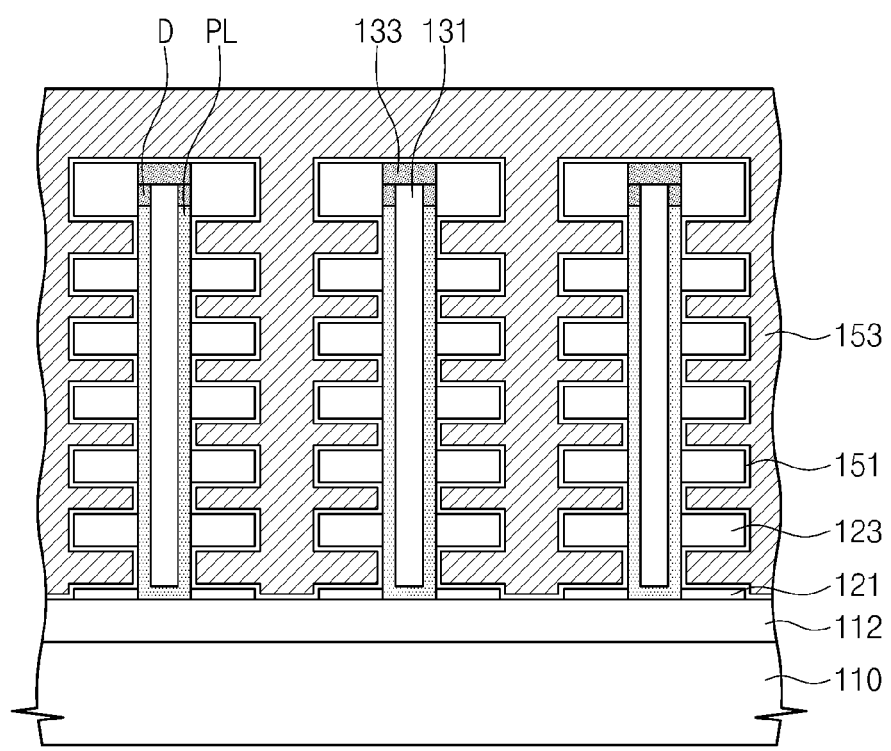

Referring to FIG. 41, a data storage layer 151 may be conformally formed in the empty spaces 145. The data storage layer 151 may include a tunnel insulation layer contacting the active pillars PL, a charge storage layer on the tunnel insulation layer opposite to the active pillars PL, and a blocking insulation layer on the charge storage layer opposite to the tunnel insulation layer. The tunnel insulation layer may include a silicon oxide layer. The tunnel insulation layer may be formed by thermally oxidizing the active pillars PL exposed by the empty spaces 145. Alternatively, the tunnel insulation layer may be formed using an atomic layer deposition (ALD) process. The charge storage layer may be an insulation layer including a charge trap layer or conductive nano dots. The charge trap layer may include a silicon nitride layer. The blocking insulation layer may include a high-k dielectric layer (e.g., an aluminum oxide layer or a hafnium oxide layer). The blocking insulation layer may be a laminated layer including a plurality of thin films. For example, the blocking insulation layer may include an aluminum oxide layer and a silicon oxide layer. The stack order of the aluminum oxide layer and the silicon oxide layer may be various. The charge storage layer and the blocking insulation layer may be formed using an atomic layer deposition (ALD) process and/or a chemical vapor deposition (CVD) process exhibiting an excellent step coverage characteristic.

A gate conductive layer 153 may be formed on the data storage layer 151. The gate conductive layer 153 may be formed to fill the empty spaces 145 surrounded by the data storage layer 151. Further, the gate conductive layer 153 may be formed to partially or completely fill the grooves 143. The gate conductive layer 153 may be formed of at least one of a doped silicon layer, a tungsten layer, a metal nitride layer and a metal silicide layer. The gate conductive layer 153 may be formed using an atomic layer deposition (ALD) process.

Figure 42:
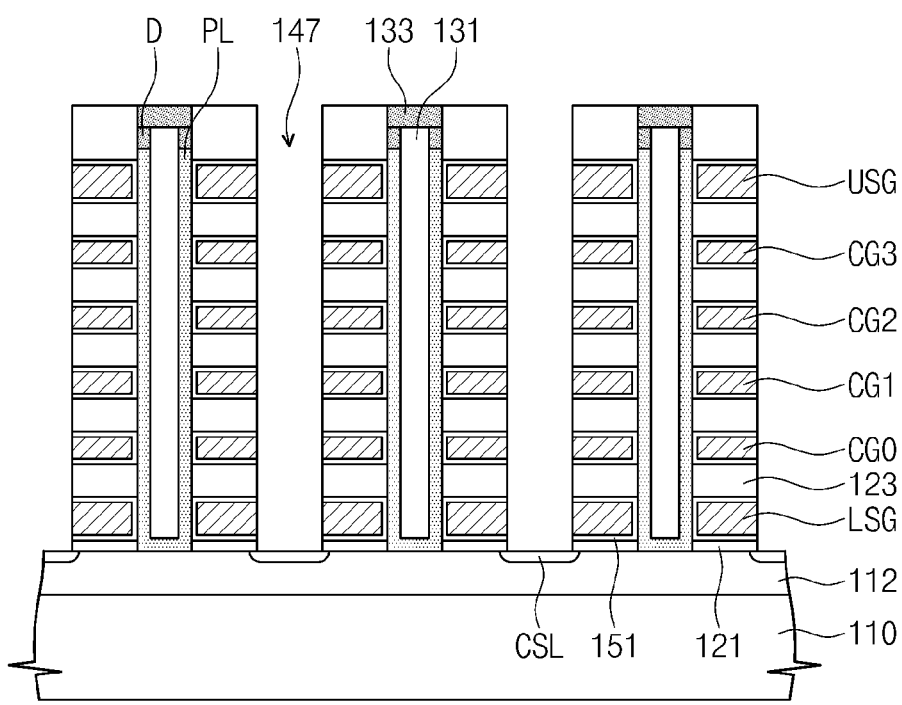

Referring to FIG. 42, the gate conductive layer 153 formed outside the empty spaces 145 may be removed to form gates in empty spaces 145. The gates may include upper selection gates USG, control gates CG0-CG3, lower selection gates LSG. The upper selection gates USG may be spaced apart from each other by isolation region 147 corresponding to the grooves 143 and may be arrayed in the second direction. The control gates CG0, CG1, CG2 or CG3 may also be spaced apart from each other by the isolation region 147 and may be arrayed in the second direction. Similarly, the lower selection gates LSG may be spaced apart from each other by the isolation region 147 and may be arrayed in the second direction. The gate conductive layer 153 in the grooves 143 may be removed to expose the substrate 110. Impurity ions of the second conductivity type may be implanted into the exposed substrate 110 to form common source lines CSL under the grooves 143. The first material layers 123 between the gates USG, CG0-CG3 and LSG may function as inter-gate insulation layers.

Figure 43:
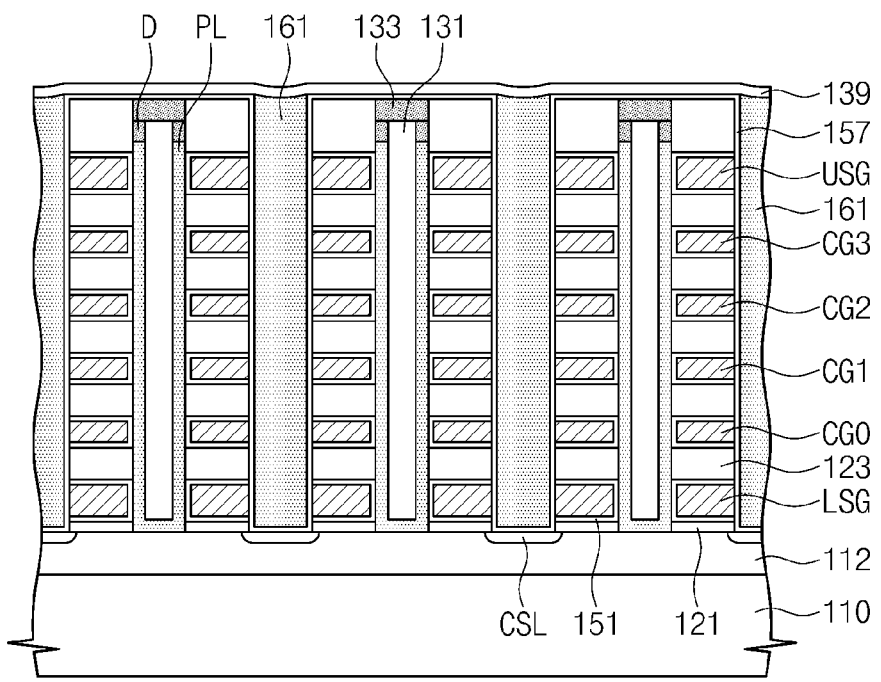

Referring to FIG. 43, a capping layer 157 may be formed to cover the gates USG, CG0-CG3 and LSG and the inter-gate insulation layers. The capping layer 157 may be a silicon oxide layer formed using a CVD process or an ALD process. A fourth sacrificial layer 161 may be formed to fill the isolation region 147 using the method described with reference to FIG. 2. The fourth sacrificial layer 161 may be planarized to expose the capping layer 157 on the uppermost first material layer 123 or the uppermost first material layer 123. The planarization process may be performed using a chemical mechanical polishing (CMP) process. A third porous insulation layer 139 may be formed on the substrate including the planarized fourth sacrificial layer 161. The third porous insulation layer 139 may be formed using the method described with reference to FIG. 2.

Figure 44:
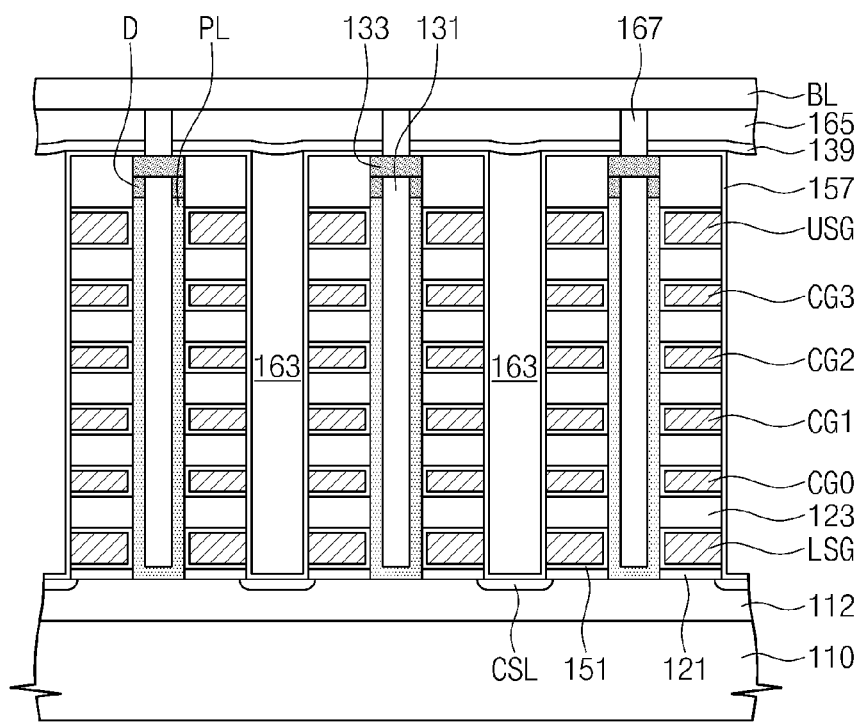

Referring to FIG. 44, the fourth sacrificial layer 161 may be selectively removed using a chemical gas or a wet etchant penetrating the third porous insulation layer 139 via the pores. The fourth sacrificial layer 161 may be selectively removed using the same method as described with reference to FIG. 3. Thus, fifth air gaps 163 may be formed in the isolation region (147 of FIG. 42) surrounded by the capping layer 157. Each of the fifth air gaps 163 may be an empty space surrounded by the substrate 110, the gates, the inter-gate insulation layers 123 and the third porous insulation layer 139. The fifth air gaps 163 may extend in the first direction and may separate the gates which are laterally adjacent to each other.

A third interlayer insulation layer 165 may be formed on the third porous insulation layer 139. The third interlayer insulation layer 165 may be a silicon oxide layer. Conductive pillars 167 may be formed to penetrate the third interlayer insulation layer 165 and the third porous insulation layer 139. The conductive pillars 167 may contact respective ones of the capping semiconductor patterns 133. Bit lines BL may be formed on the third interlayer insulation layer 165. The bit lines BL may be formed to contact the conductive pillars 167.

A semiconductor device according to example embodiments will now be described with reference to FIGS. 44, 45 and 46.

Figure 45:
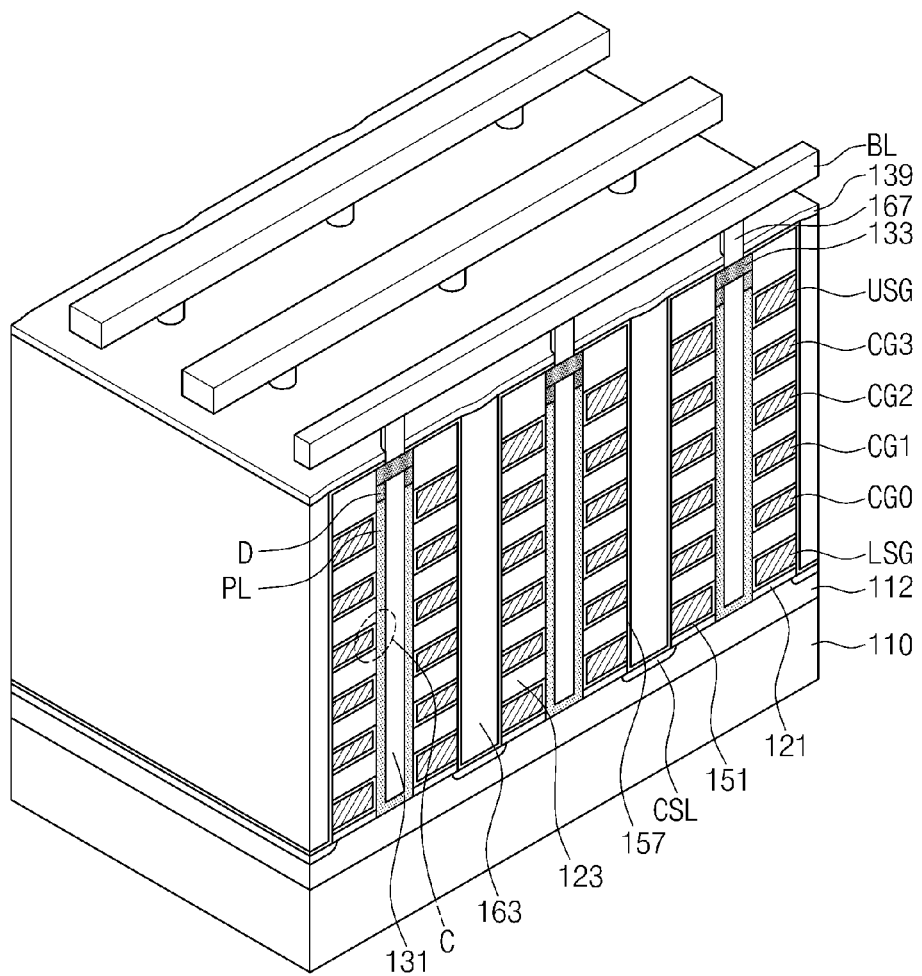
FIG. 45 is a perspective view relating to FIG. 44.
Figure 46:
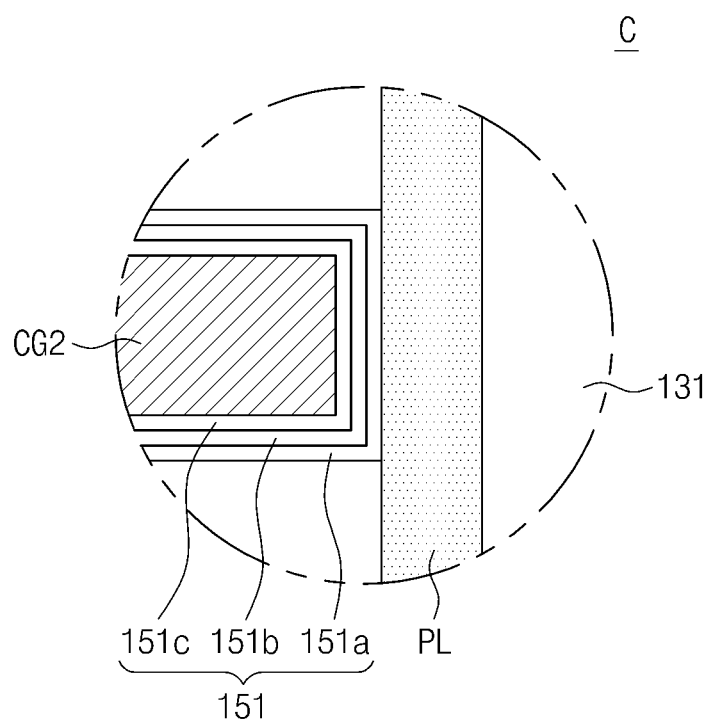
FIG. 46 is an enlarged view illustrating a portion 'C' of FIG. 45.

FIG. 45 is a perspective view relating to FIG. 44, and FIG. 46 is an enlarged view illustrating a portion 'C' of FIG. 45.

Referring to FIGS. 44, 45 and 46, a buffer dielectric layer 121 may be provided on a substrate 110. A well region 112 of a first conductivity type may be provided in an upper portion of the substrate 110. A top surface of the well region 112 may correspond to a top surface of the substrate 110. The buffer dielectric layer 121 may be a silicon oxide layer. A plurality of inter-gate insulation layers 123 and a plurality of gates may be alternately stacked on the buffer dielectric layer 121.

The gates may include lower selection gates LSG, upper selection gates USG, and control gates CG0-CG3 between the lower selection gates LSG and the upper selection gates USG. Each of the gates LSG, CG0-CG3 and USG may have a line shape extending in a first direction. Each of the gates LSG, CG0-CG3 and USG may include at least one of a doped silicon layer, a tungsten layer, a metal nitride layer and a metal silicide layer.

A plurality of active pillars PL may penetrate the gates LSG, CG0-CG3 and USG to be connected to the substrate 110. Each of the active pillars PL may have a vertical major axis which is perpendicular to the top surface of the substrate 110. Each of the active pillars PL may include a semiconductor material. Each of the active pillars PL may have a vertical bar shape without any empty space therein or a cylindrical shape with an empty space therein (e.g., a macaroni shape). When each of the active pillars PL has the macaroni shape, the inner empty space of each of the active pillars PL may be filled with a filling insulation layer 131. The active pillars PL and the substrate 110 may constitute a single unified semiconductor that has a continuous structure without any heterogeneous junction therebetween. Each of the active pillars PL may be a single crystalline semiconductor. In other example embodiments, a discontinuous interface may exist between each of the active pillars PL and the substrate 110. That is, a heterogeneous junction may exist between each of the active pillars PL and the substrate 110. Each of the active pillars PL may be a poly crystalline semiconductor or an amorphous semiconductor. Each of the active pillars PL may include a body contacting the substrate 110, and a drain region D disposed on an upper end of the body to be spaced apart from the substrate 110. The bodies of the active pillars PL may have the first conductivity type, and the drain regions D of the active pillars PL may have a second conductivity type different from the first conductivity type.

One end (e.g., the body) of each of the active pillars PL may be connected to the substrate 110, and the other end (e.g., the drain D) of each of the active pillars PL may be connected to one of bit lines BL. The bit lines BL may extend in a second direction intersecting the first direction. Each of the active pillars PL may be electrically connected to one of the bit lines BL, and each of the bit lines BL may be electrically connected to a plurality of cell strings. The active pillars PL may be arrayed along the first direction and the second direction. That is, the active pillars PL may be disposed in a matrix form, when viewed from a plan view. Thus, intersections of the control gates CG0-CG3 and the active pillars PL may be three dimensionally disposed. Memory cells of the semiconductor device according to example embodiments may be provided at the intersections of the control gates CG0-CG3 and the active pillars PL, which are three dimensionally disposed. That is, each of the memory cells may be configured to include one of the active pillars PL and one of the control gates surrounding the active pillar PL.

A data storage layer 151 may be provided between the control gates CG0-CG3 and the active pillars PL. The data storage layer 151 may extend onto top surfaces and bottom surfaces of the gates LSG, CG0-CG3 and USG. The data storage layer 151 may include a blocking insulation layer 151c adjacent to the control gates CG0-CG3, a tunnel insulation layer 151a adjacent to the active pillars PL, and a charge storage layer 151b therebetween. The blocking insulation layer 151c may include a high-k dielectric layer (e.g., an aluminum oxide layer or a hafnium oxide layer). The blocking insulation layer may be a laminated layer including a plurality of thin films. For example, the blocking insulation layer may include an aluminum oxide layer and a silicon oxide layer. The stack order of the aluminum oxide layer and the silicon oxide layer may be various. The charge storage layer 151b may be an insulation layer including a charge trap layer or conductive nano dots. The charge trap layer may include a silicon nitride layer. The tunnel insulation layer may include a silicon oxide layer.

A capping layer 157 may be disposed to cover the gates USG, CG0-CG3 and LSG and the inter-gate insulation layers. The capping layer 157 may be, for example, a silicon oxide layer. A third porous insulation layer 139 may be provided on the capping layer 157 formed on the drain regions D. The third porous insulation layer 139 may laterally extend to cover empty spaces between the gates. A bottom surface of the third porous insulation layer 139 over the empty spaces between the gates laterally adjacent to each other may be lower than a bottom surface of the third porous insulation layer 139 on the capping layer 157.

Fifth air gaps 163 may be provided between the gates laterally adjacent to each other and under the third porous insulation layer 139. Each of the fifth air gaps 163 may correspond to the empty space surrounded by a top surface of the substrate 110, sidewalls of the gates, sidewalls of the inter-gate insulation layers 123 and a bottom surface of the third porous insulation layer 139. The fifth air gaps 163 may extend in the first direction and may separate the gates which are laterally adjacent to each other.

A third interlayer insulation layer 165 may be provided on the third porous insulation layer 139. The third interlayer insulation layer 165 may be a silicon oxide layer. Conductive pillars 167 may be provided to penetrate the third interlayer insulation layer 165 and the third porous insulation layer 139. The conductive pillars 167 may be electrically connected to respective ones of the capping semiconductor patterns 133. Bit lines BL extending in the second direction may be provided on the third interlayer insulation layer 165. The bit lines BL may be electrically connected to the conductive pillars 167.

The semiconductor device according to the present example embodiments may be a NAND-type flash memory device including having a plurality of cell strings, and each of the cell strings may include a plurality of memory cells provided with one active pillar.

According to example embodiments, because the fifth air gaps 163 are filled with air, dielectric constants of the fifth air gaps 163 may be lower than a dielectric constant of a silicon oxide layer. Thus, the fifth air gaps 163 may significantly reduce the parasitic capacitance between gates laterally adjacent to each other. That is, the fifth air gaps 163 can minimize an interference effect between the adjacent memory cells.

Figure 47:
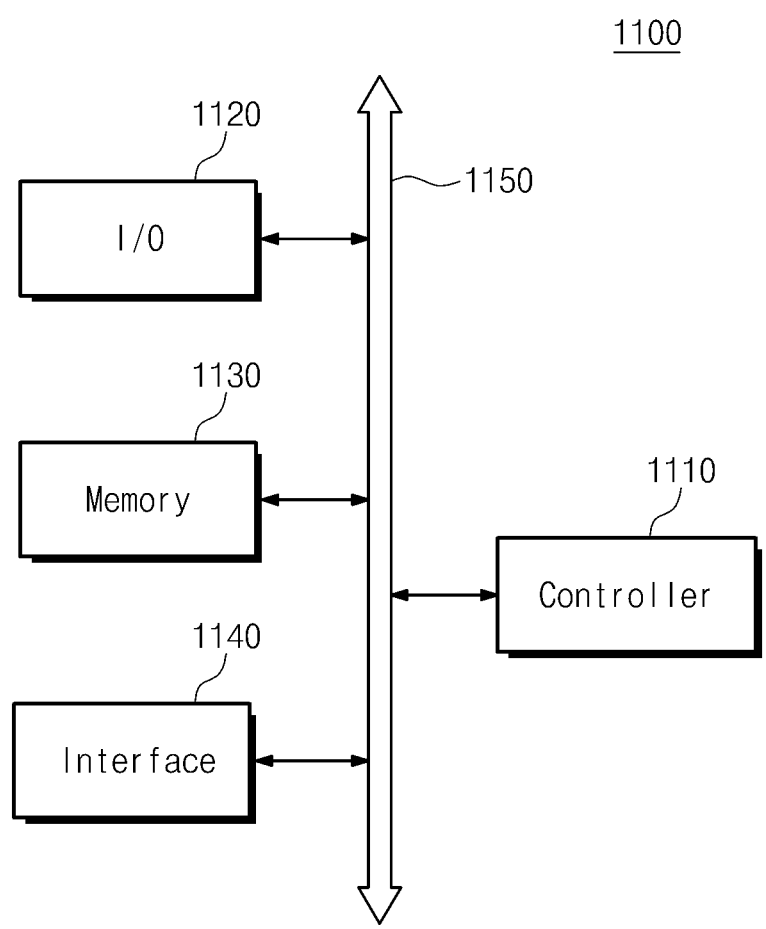
FIG. 47 is a schematic block diagram illustrating an example of electronic systems including semiconductor devices according to example embodiments.

FIG. 47 is a schematic block diagram illustrating an example of electronic systems including semiconductor devices according to example embodiments.

Referring to FIG. 47, an electronic system 1100 may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. That is, the data bus 1150 may correspond to a path through which electrical signals are transmitted. At least one of the controller 1110, the I/O unit 1120, the memory device 1130 and the interface unit 1140 may include at least one of the semiconductor devices according to the example embodiments described above.

The controller 1110 may include at least one of a microprocessor, a digital signal processor (DSP), a microcontroller and a logic device having a similar function thereto. The I/O unit 1120 may include a keypad, a keyboard or a display unit. The memory device 1130 may store data and/or commands executed by the controller 1110. The interface unit 1140 may receive data or signals from an external communication network system or may transmit data or signals to the external communication network system. The interface unit 1140 may operate by wireless or by cable. For example, the interface unit 1140 may include an antenna for wireless communication or a transceiver for wireless or cable communication. Although not shown in the drawing, the electronic system

1100 may further include a fast dynamic random access memory (DRAM) device and/or a fast static random access memory (SRAM) device that improves operation of the controller 1110.

The electronic system 1100 may be applied to personal digital assistants (PDAs), portable computers, web tablets, wireless phones, mobile phones, digital music players, memory cards or the like. Further, the electronic system may also be applied to other electronic products that receive or transmit information data by wireless.

Figure 48:
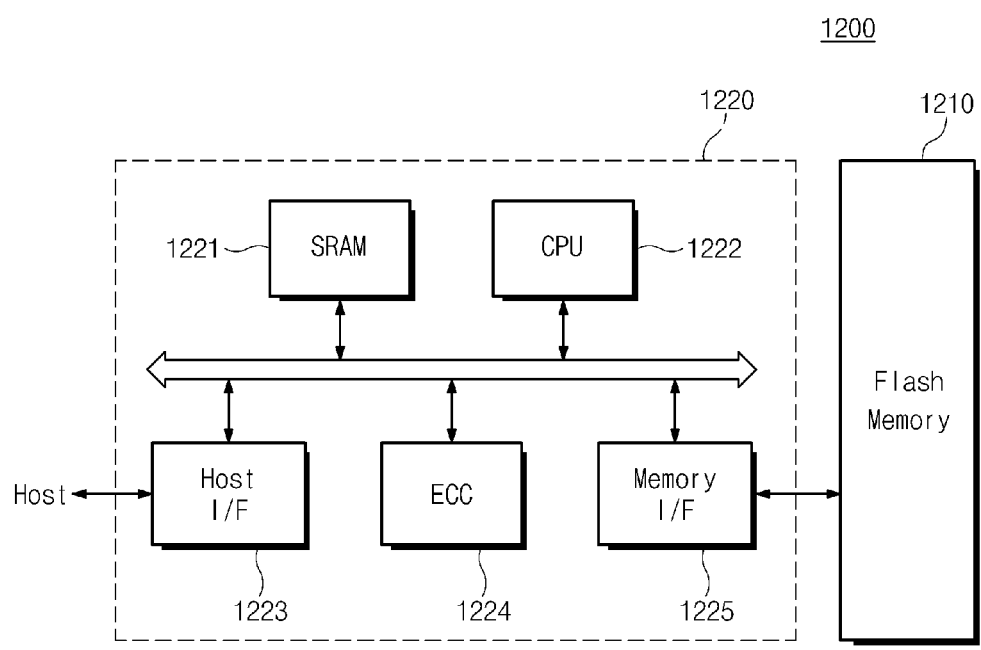
FIG. 48 is a schematic block diagram illustrating an example of memory cards including semiconductor devices according to example embodiments.

FIG. 48 is a schematic block diagram illustrating an example of memory cards including the semiconductor devices according to example embodiments.

Referring to FIG. 48, a memory card 1200 may include a memory device 1210. The memory device 1210 may include at least one of the semiconductor devices according to the example embodiments described above. Further, the memory device 1210 may further include another type of semiconductor memory device, for example, a dynamic random access memory (DRAM) device and/or a static random access memory (SRAM) device. The memory card 1200 may further include a memory controller 1220 that controls data communication between a host and the memory device 1210. The memory device 1210 and/or the memory controller 1220 may include at least one of the semiconductor devices according to the example embodiments described above.

The memory controller 1220 may include a central processing unit (CPU) 1222 that controls overall operations of the memory card 1200. Moreover, the memory controller 1220 may further include a static random access memory (SRAM) device 1221 that is used as an operation memory of the CPU 1222. In addition, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. Furthermore, the memory controller 1220 may include an error check and correction (ECC) block 1224. The ECC block 1224 may detect and correct errors of data which are read out from the memory device 1210. Even though not shown in the drawing, the memory card 1200 may further include a read only memory (ROM) device that stores code data to interface with the host. The memory card 1200 may be used as a portable data storage media. Alternatively, the memory card 1200 may be realized using a solid state disk (SSD) that can replaces hard disks of computer systems.

Figure 49:
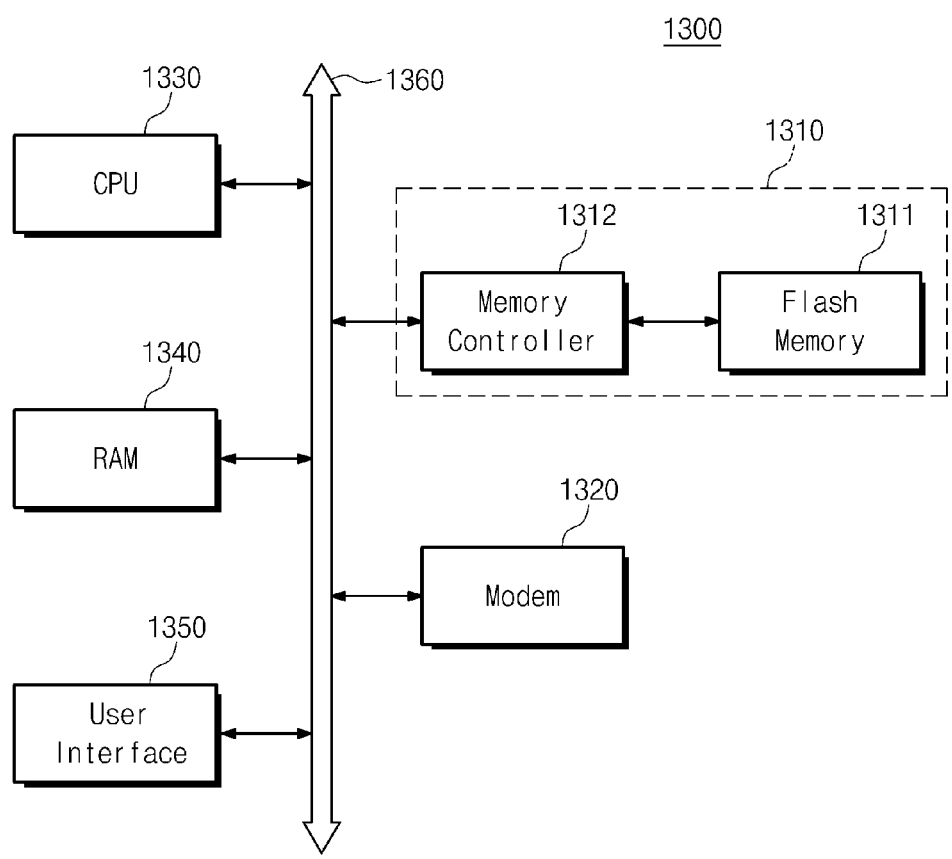
FIG. 49 is a schematic block diagram illustrating an example of information processing systems in which semiconductor devices according to example embodiments are mounted.

FIG. 49 is a block diagram illustrating an example of information processing systems in which semiconductor devices according to example embodiments are mounted.

Referring to FIG. 49, at least one of the semiconductor devices according to example embodiments may be mounted in a memory unit 1310, and the memory unit 1310 may be employed (or, used) in an information processing system 1300, for example, a mobile system, a desk top computer or the like. The information processing system 1300 may further include a modulator-demodulator (MODEM) 1320, a central processing unit (CPU) 1330, a random access memory (RAM) device 1340 and a user interface unit 1350 that communicate with the memory unit 1310 through a data bus 1360. At least two of the memory unit 1310, the MODEM 1320, the CPU 1330, the RAM device 1340 and the user interface unit 1350 may also communicate with each other through the data bus 1360. The memory unit 1310 may have substantially the same configuration as the memory card 1200 illustrated in FIG. 48. That is, the memory unit 1310 may include a flash memory device 1311 and a memory controller 1312 that controls overall operations of the flash memory device 1311.

The memory unit 1310 may store data processed by the CPU 1330 or data received from an external system. The memory unit 1310 may be configured to include a solid state disk. In this case, the memory unit 1310 constituting the information processing system 1300 may stably and reliably store a large capacity of data. If the reliability of the memory unit 1310 is improved, the information processing system 1300 may save sources that are required to check and correct data. As a result, the information processing system 1300 may provide fast data communication. Even though not shown in the drawings, the information processing system 1300 may further include a camera image processor, an application chipset and/or an input/output unit.

The semiconductor devices according to example embodiments described above may be encapsulated using various packaging techniques. For example, the semiconductor devices according to the aforementioned example embodiments may be encapsulated using any one of a package on package (PoP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi chip package (MCP) technique, a wafer-level fabricated package (WFP) technique and a wafer-level processed stack package (WSP) technique.

According to the example embodiments set forth above, a semiconductor device is provided to include an air gap formed between active regions and/or between interconnections. Because the air gap is filled with air, a dielectric constant of the air gap may be lower than that of a silicon oxide layer. Thus, the air gap can significantly reduce the parasitic capacitance between the active regions and/or between the interconnections. As a result, the air gap can minimize an interference effect between memory cells adjacent to each other.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
 a plurality of stack structures comprising gate electrodes and inter-gate first insulation layers alternately and repeated stacked on a substrate, wherein adjacent stack structures of the plurality of stack structures are separated by an air gap;

a plurality of active pillars penetrating the plurality of stack structures to connect to the substrate; and a second insulation layer containing carbon on the plurality of stack structures and extending over the air gap between the adjacent stack structures;

wherein the second insulation layer extending directly over the air gap between the adjacent structures are at a lower level than the second insulation layer on the plurality of stack structures.

2. The semiconductor device of claim 1, wherein the plurality of stack structures extend in a first direction parallel to a top surface of the substrate, wherein the adjacent stack structures are separated in a second direction crossing the first direction.

3. The semiconductor device of claim 1, further comprising a capping layer disposed between the plurality of stack structures and the second insulation layer and disposed between the plurality of stack structures and the air gap.

4. The semiconductor device of claim 1, wherein at least one of an upper surface and a lower surface of the second insulation layer extending over the air gap between the adjacent stack structures is at a lower level than a corresponding at least one of an upper surface and a lower surface of the second insulation layer extending on the plurality of stack structures.

5. The semiconductor device of claim 1, wherein the second insulation layer is a substantially continuous layer.

* * * * *